United States Patent [19]
Yamamoto

[11] Patent Number: 5,815,511
[45] Date of Patent: Sep. 29, 1998

[54] SEMICONDUCTOR INTEGRATED CIRCUIT EQUIPPED WITH TEST CIRCUIT

[75] Inventor: Yasuhiro Yamamoto, Kasugai, Japan

[73] Assignee: Fujitsu Limited, Kanagawa, Japan

[21] Appl. No.: 728,978

[22] Filed: Oct. 11, 1996

[30] Foreign Application Priority Data

Oct. 13, 1995 [JP] Japan .................................. 7-265927

[51] Int. Cl.⁶ .................................................. G01R 31/28
[52] U.S. Cl. ..................................... 371/22.5; 395/183.19
[58] Field of Search .............................. 371/22.39, 22.5,
371/24, 27.5, 3, 21.2, 21.6, 22.6, 25.1,
40.2, 47.1, 67.1; 395/183.06, 185.01, 183.19,
183.12; 324/500, 765, 528, 512, 76.11;
327/40, 90

[56] References Cited

U.S. PATENT DOCUMENTS

| | | | |
|---|---|---|---|
| 5,166,937 | 11/1992 | Blecha, Jr. | 371/22.5 |
| 5,225,774 | 7/1993 | Imamura | 324/158 R |
| 5,369,646 | 11/1994 | Shikatani | 371/22.5 |
| 5,457,381 | 10/1995 | Farwell | 324/158.1 |
| 5,615,216 | 3/1997 | Saeki | 371/22.1 |
| 5,648,973 | 7/1997 | Mote, Jr. | 371/223 |
| 5,656,953 | 8/1997 | Whetsel | 326/83 |

*Primary Examiner*—Robert W. Beausoliel, Jr.
*Assistant Examiner*—Nadeem Iqbal
*Attorney, Agent, or Firm*—Nikaido, Marmelstein, Murray & Oram LLP

[57] ABSTRACT

An integrated circuit device equipped with a test circuit includes a plurality of input/output terminals, an input terminal, and an internal circuit for receiving input data via the plurality of input/output terminals and outputting output data. The test circuit permits data exchange among the input/output terminals, the input terminal and the internal circuit. The test circuit preferably operates in a normal mode to supply input data to the internal circuit through the input/output terminals, and supply output data from the internal circuit through the input/output terminals. The test circuit further operates in a test mode to supply test input data to the internal circuit through one of the input terminal and the input/output terminals. The test circuit further supplies test output data that is output from the internal circuit to one of the input terminal and the input/output terminals which differ from the test input data supplied terminal.

22 Claims, 19 Drawing Sheets

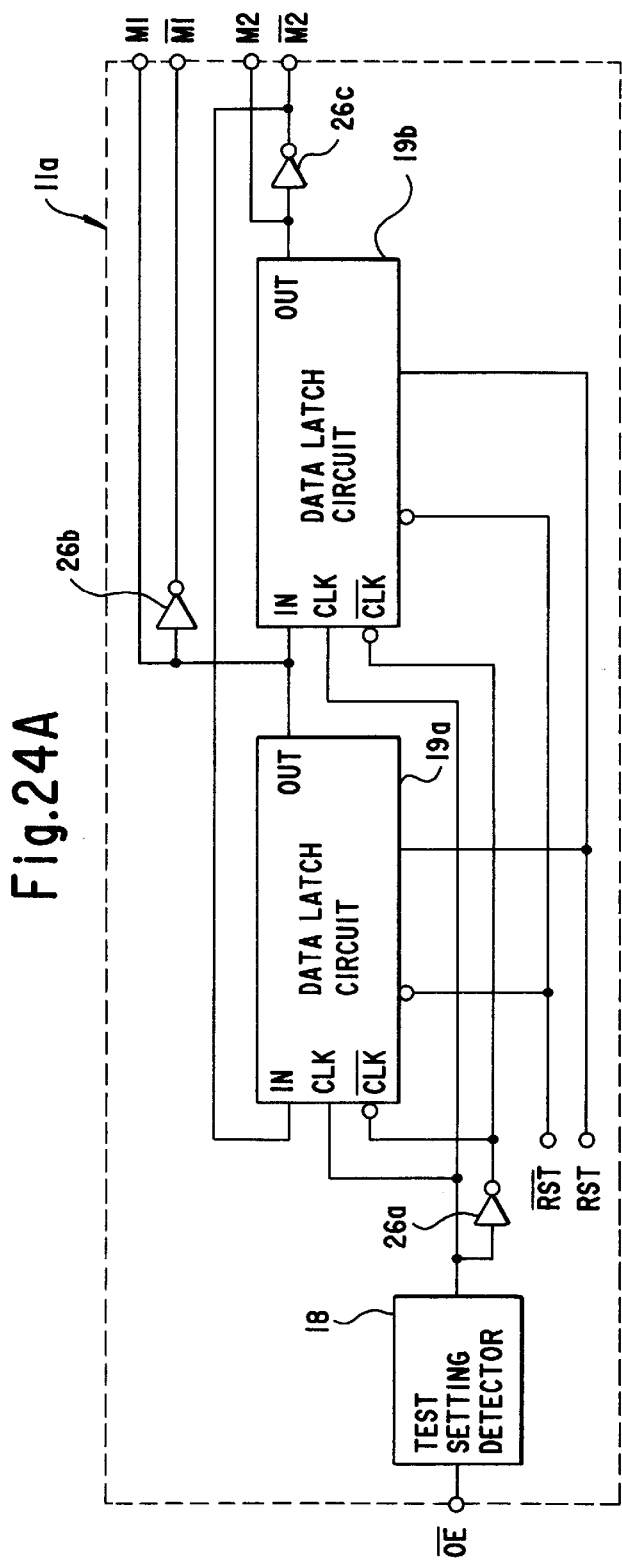

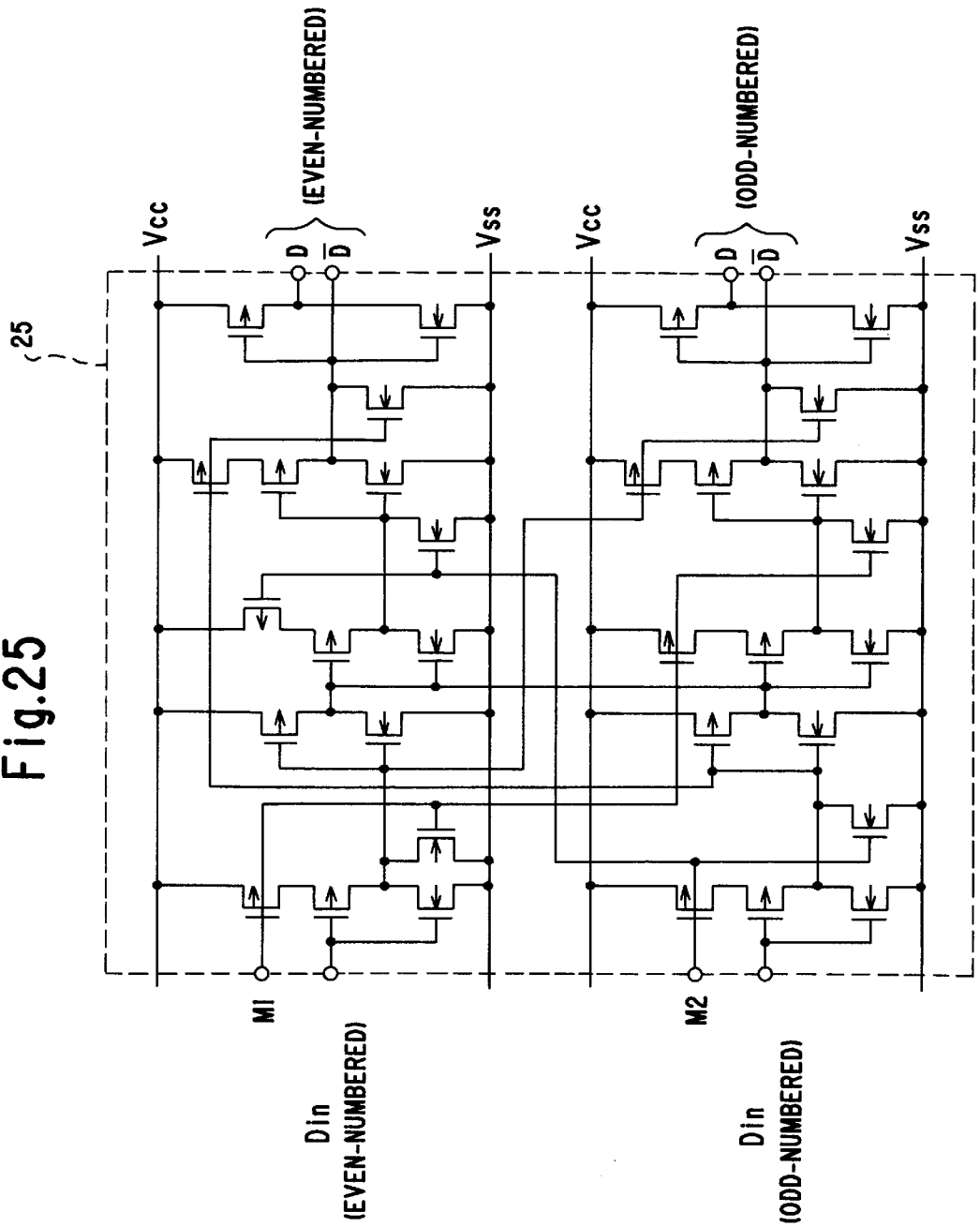

SEMICONDUCTOR INTEGRATED CIRCUIT EQUIPPED WITH TEST CIRCUIT

BACKGROUND OF THE INVENTION

1. Field of the Invention

The present invention relates generally to a semiconductor integrated circuit device equipped with a test circuit. More particularly, the invention relates to a test circuit which is capable of executing a reliable operation test in a semiconductor memory device or a semiconductor integrated circuit device with an increased operation speed.

2. Description of the Related Art

Recent semiconductor devices include devices, such as a synchronous DRAM, whose operation frequency is over 100 MHz. Operation tests for such semiconductor devices are generally conducted after packaging. As shown in FIG. 1, for example, a memory 101 like a synchronous DRAM has input/output terminals I/O which are shared in data input/output operations. A test device 103 includes a data output circuit 104 which has an output terminal connected via a coaxial cable 102 to each input/output terminal I/O and a comparator 105 which has an input terminal connected via the coaxial cable 102 to the input/output terminal I/O.

In a test mode, the data output circuit 104 supplies write data to the memory 101 via the coaxial cable 102 and each input/output terminal I/O to permit the memory 101 to execute a writing operation. The comparator 105 immediately reads written data from the memory 101 and receives the read data via the input/output terminal I/O and the coaxial cable 102. The comparator 105 compares the write data with the read data to determine if the memory 101 is properly functioning. The operation test for the memory 101 is carried out in this manner.

When an operation test is performed for a memory which has a relatively high operation frequency, however, a so-called bus fight occurs in which write data output from the data output circuit 104 conflicts or fights against read data from the memory 101 on the coaxial cable 102. This will now be described in more detail. As shown in FIG. 2, the data output circuit 104 repeats the alternate output of write data WD and an output high impedance $H_{IZ}$ at a repeat cycle t1 of 5 ns (i.e., in an operation test for a fast memory). Therefore, the write data WD reaches each input/output terminal I/O of the memory 101 via the coaxial cable 102 with a delay time t2. When a predetermined operation delay time t3 passes after the arrival of the write data WD, read data RD reaches the comparator 105 via the coaxial cable 102 with a delay time t2. At a time t4 that is within the period in which the next write data WD is output from the data output circuit 104, however, the read data RD competes against the next write data WD on the coaxial cable 102, causing a bus fight. Consequently, at high operation frequencies, the above-described test device 103 will be unable to execute a proper operation test.

To prevent such a bus fight, an operation test as illustrated in FIG. 3 has been proposed. The output terminal of the data output circuit 104 is connected via a first coaxial cable 106a to each input/output terminal I/O of the memory 101, which is further connected via a second coaxial cable 106b to the input terminal of the comparator 105. The data output circuit 104 supplies write data WD to the input/output terminal I/O of the memory 101 via the first coaxial cable 106a, and the comparator 105 receives read data RD via the second coaxial cable 106b. As the write data WD and the read data RD are transferred in the separate first and second coaxial cables 106a and 106b, no bus fight occurs.

When the read data RD from the memory 101 is supplied to the comparator 105, however, echo from the data output circuit 104 may be mixed as noise in the read data RD, which will be specifically discussed below. Read data RD output on the first coaxial cable 106a is echoed by the output terminal of the data output circuit 104 which is in a high impedance state, and this echo reaches the comparator 105 via the first and second coaxial cables 106a and 106b. Consequently, the echo from the data output circuit 104 is mixed as noise in the read data RD. The write data WD output from the data output circuit 104 is supplied to the memory 101 via the first coaxial cable 106a and also to the comparator 105 via the first and second coaxial cables 106a and 106b. The impedance of the input terminal of the comparator 105 is higher than the impedance at the node between the first and second coaxial cables 106a and 106b. Therefore, the write data WD is echoed by the input terminal of the comparator 105 that is supplied to the memory 101 via the second coaxial cable 106b. As a result, the echo from the comparator 105 is mixed as noise in the write data WD. This mixture of noise makes the proper writing and reading operation difficult, such that an effective operation test cannot be performed.

To overcome such a shortcoming, each input/output terminal may be comprised of an input pad and an output pad before the packaging of the memory 101. With this structure, an operation test can be conducted during wafer testing that is performed prior to packaging the memory chip. In the operation test, write data is input via the input pad and read data is output via the output pad. This terminal structure can allow a proper operation test to be conducted without being affected by a signal delays that originate from the cables. The input pad and the output pad are connected by a bonding wire after the wafer test, and then the memory chip is packaged. Memory chips manufactured in this manner can have input/output terminals that are shared in data input/output operations.

However, this testing method cannot be used to execute a memory operation test after the memory chip is packaged. A further disadvantage is that the inclusion of the input pad and the output pad for each input/output terminal will increase the chip surface area requirements. Further, the input/output terminal that has the input pad and the output pad connected together has an increased parasitic capacitance, which unfortunately reduces data input/output speed.

To suppress an increase in chip surface area and the increased parasitic capacitance of each input/output terminal, a memory chip may be designed to have a single input pad, a single output pad for an operation test, a multiplexer and an XOR(Exclusive OR) gate. In a test mode, the multiplexer receives write data through the single input pad for the operation test and supplies the data to a plurality of input/output terminals. The XOR gate receives read data output from the plurality of input/output terminals and sends out the data through the single output pad for the operation test. After the operation test, the multiplexer and XOR gate are disabled after which the memory chip is packaged.

Although this arrangement has the aforementioned advantages, it is still unable to conduct an operation test after it has been packaged. Furthermore, it is still not possible to accurately execute an operation test for fast operating semiconductor devices. As a result, manufacturers must perform operation tests for these semiconductor devices as part of an overall system operation test which may or may not provide accurate testing results.

SUMMARY OF THE INVENTION

Broadly speaking, the present invention relates to a semiconductor integrated circuit device which reliably executes an operation test after packaging. The present invention can be implemented in numerous ways as an apparatus and method.

In one embodiment, a semiconductor integrated circuit equipped with a test circuit is disclosed. The integrated circuit device includes a plurality of input/output terminals, an input terminal, and an internal circuit for receiving input data via the plurality of input/output terminals and outputting output data therefrom. The integrated circuit device further includes a test circuit for permitting data exchange among the plurality of input/output terminals, the input terminal and the internal circuit. The test circuit preferably operates in a normal mode to supply input data to the internal circuit through the input/output terminals, and supply output data from the internal circuit through the input/output terminals. The test circuit further operates in a test mode to supply test input data to the internal circuit through one of the input terminal and the input/output terminals. The test circuit further supplies test output data that is output from the internal circuit to one of the input terminal and the input/output terminals which differ from the test input data supplied terminal.

In another embodiment, a semiconductor integrated circuit device having a test circuit is disclosed. The semiconductor integrated circuit device includes a plurality of input/output terminals, a control signal input terminal, an internal circuit for receiving input data via the plurality of input/output terminals and outputting output data therefrom, and a test circuit for permitting data exchange among the plurality of input/output terminals, the control signal input terminal and the internal circuit. The test circuit includes a plurality of input buffer circuits for receiving input data that is input through the input/output terminals. The plurality of input buffer circuits further supply the input data to the internal circuit in response to a first control signal sent in a normal mode. A plurality of output buffer circuits are further included for receiving output data from the internal circuit and supplying the output data to the associated input/output terminals in response to the first control signal that is sent in a normal mode. In response to a second control signal supplied to the control signal input terminal in a test mode, the test circuit controls the input buffer circuits to supply test input data that is input to one of the control signal input terminal and the input/output terminals to the internal circuit. The test circuit further controls the output buffer circuits to supply test output data that is output from the internal circuit to one of the control signal input terminal and the input/output terminals which differ from the test input data supplied terminal.

In yet another embodiment, a semiconductor integrated circuit device is disclosed. The semiconductor integrated circuit device further includes a plurality of input/output terminals, a control signal input terminal, an internal circuit for receiving input data via the plurality of input/output terminals and outputting output data therefrom, and a test circuit for permitting data exchange among the plurality of input/output terminals, the control signal input terminal and the internal circuit. The semiconductor integrated circuit device further includes a test mode setting circuit that is connected to the control signal input terminal. The test mode setting circuit being configured to produce a test mode setting signal in response to a set signal that is supplied to the control signal input terminal. A plurality of input buffer circuits are further included in the semiconductor integrated circuit. Each of the input buffer circuits are connected to a pair of adjoining first and second input/output terminals, the internal circuit and the test mode setting circuit. The plurality of input buffer circuits being configured to receive input data that is input to either of the first or the second input/output terminal, and supply the input data to the internal circuit. Further included is a plurality of output buffer circuits that are connected to the input/output terminals, the internal circuit and the test mode setting circuit. The plurality of output buffer circuits are preferably configured to receive output data from the internal circuit, and supply the output data to the associated input/output terminals in response to an output control signal that is supplied to the control signal input terminal. Preferably, each of the input buffer circuits supply test input data that is input to the first input/output terminal to the internal circuit as test input data for the second input/output terminal in response to the test mode setting signal. Further, the output buffer circuits associated with the second input/ouput terminals supply test output data that is output from the internal circuit and originated from the test input data to the second input/output terminal in response to the test mode setting signal.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings, and in which:

FIGS. 24A and 24B are circuit diagrams showing a third example of the test mode setting circuit;

FIG. 25 is a circuit diagram showing an input buffer circuit included in the test circuit of FIG. 20;

DETAILED DESCRIPTION OF THE PREFERRED EMBODIMENTS

Figure 1:
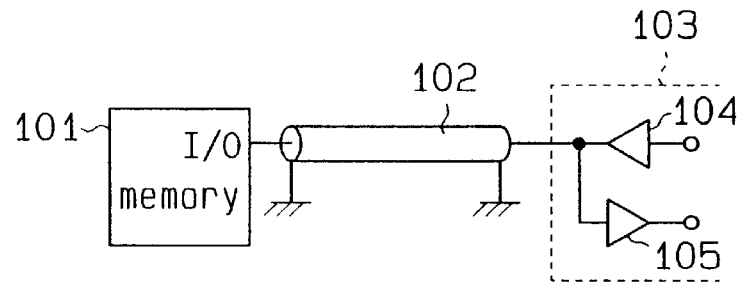
FIG. 1 is a diagram illustrating an operation testing method for a semiconductor memory device according to prior art.
Figure 2:
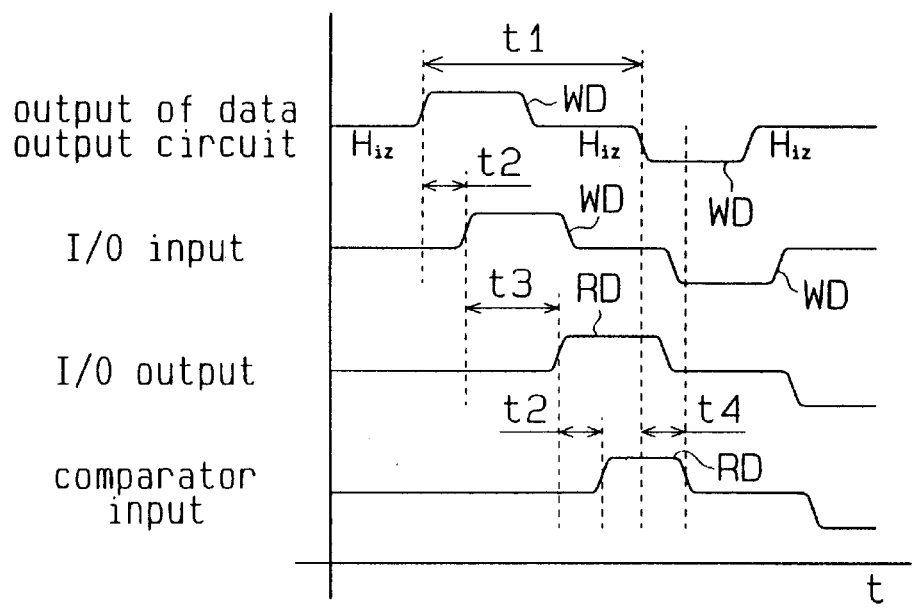
FIG. 2 is a diagram showing signal waveforms in an operation test performed according to the prior art.
Figure 3:
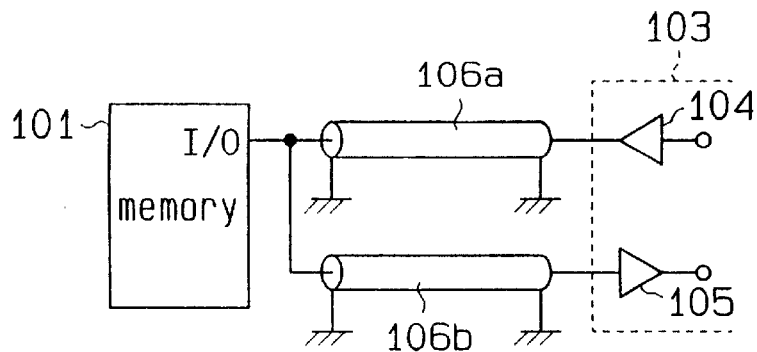
FIG. 3 is a diagram illustrating an operation testing method for a semiconductor memory device according to another prior art embodiment.
Figure 4:
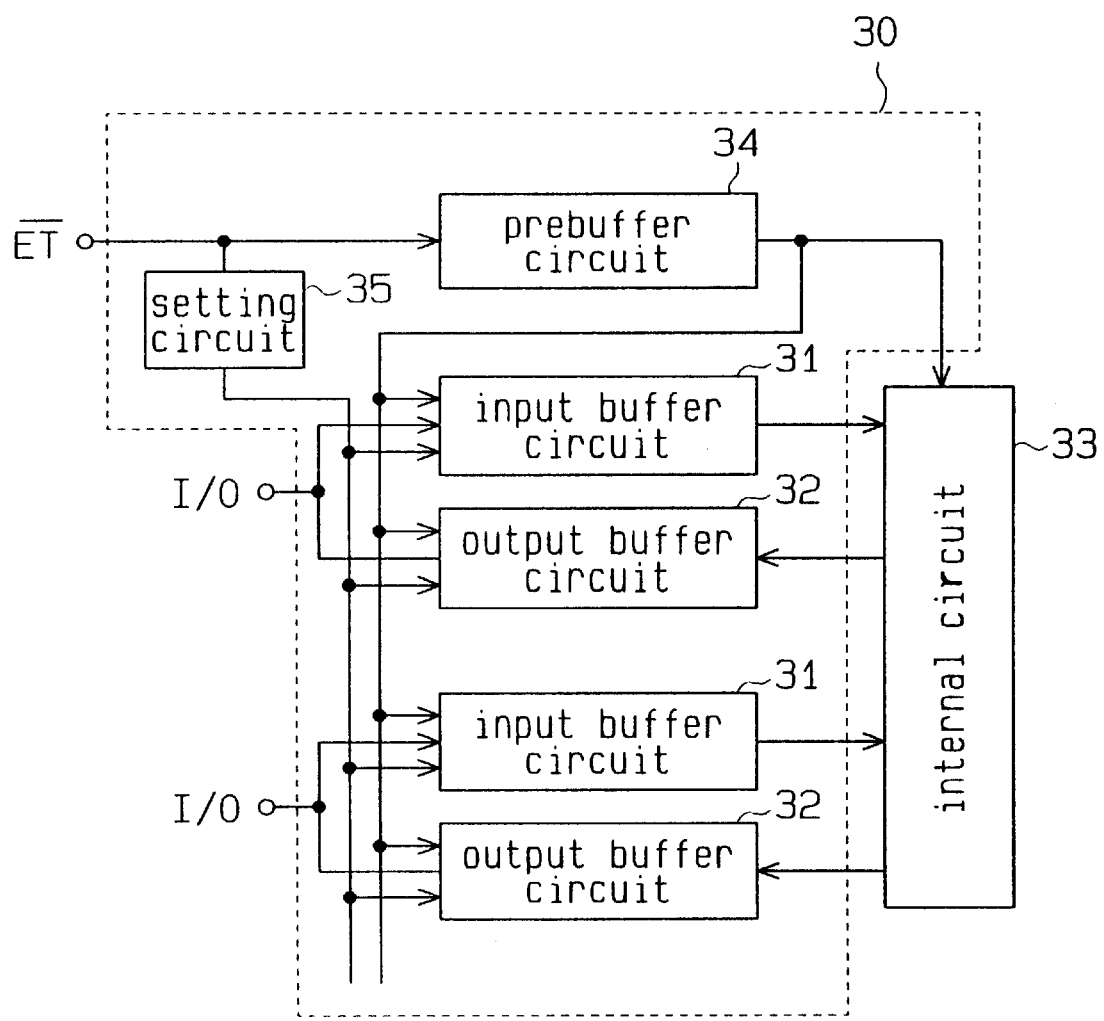
FIG. 4 is a diagram depicting the outline of a test circuit according to the invention.

FIG. 4 shows a general diagram of a semiconductor integrated circuit (IC) device in accordance with the invention. This semiconductor IC device comprises a plurality of input/output terminals I/O, a control signal input terminal /ET, an internal circuit 33 and a test circuit 30. The test circuit 30 has input buffer circuits 31 and output buffer circuits 32, that are connected between the respective input/output terminals I/O and the internal circuit 33, a single prebuffer circuit 34 and a setting circuit 35. The prebuffer circuit 34 receives an output control signal supplied from the control signal input terminal /ET, and supplies this control signal to the individual input buffer circuits 31, the individual output buffer circuits 32 and the internal circuit 33. The internal circuit 33 receives input data from the individual input buffer circuits 31 and sends plural pieces of output data to the associated output buffer circuits 32.

In response to the output control signal, each input buffer circuit 31 supplies input data, supplied to the associated input/output terminal I/O, to the internal circuit 33. In response to the output control signal, each output buffer circuit 32 supplies output data, output from the internal circuit 33, to the associated input/output terminal I/O.

The setting circuit 35 produces a test mode setting signal in response to a set signal supplied to the control signal input terminal /ET, and supplies this produced signal to the individual input buffer circuits 31 and the individual output buffer circuits 32. In response to the test mode setting signal, each input buffer circuit 31 receives test input data, supplied to the control signal input terminal /ET, via the prebuffer circuit 34 and sends the test input data to the internal circuit 33. In response to the test mode setting signal, each output buffer circuit 32 receives output data from the internal circuit 33, and sends the output data to the associated input/output terminal I/O. Advantageously, opposite operation to that described above is also possible. In this case, each output buffer circuit 32 is designed to be able to send output data to the control signal input terminal. In response to the test mode setting signal, each input buffer circuit 31 receives test input data that is supplied to the associated input/output terminal I/O, and sends the test input data to the internal circuit 33. In response to the test mode setting signal, each output buffer circuit 32 sends output data from the internal circuit 33 to the control signal input terminal /ET. In the test mode, the test circuit 30 isolates the terminals that can receive input data from the terminals, and can send out output data. This feature can ensure a reliable operation testing after packaging of a semiconductor IC device that has input/output terminals that are shared in data input/output operations.

First Embodiment

Figure 5:
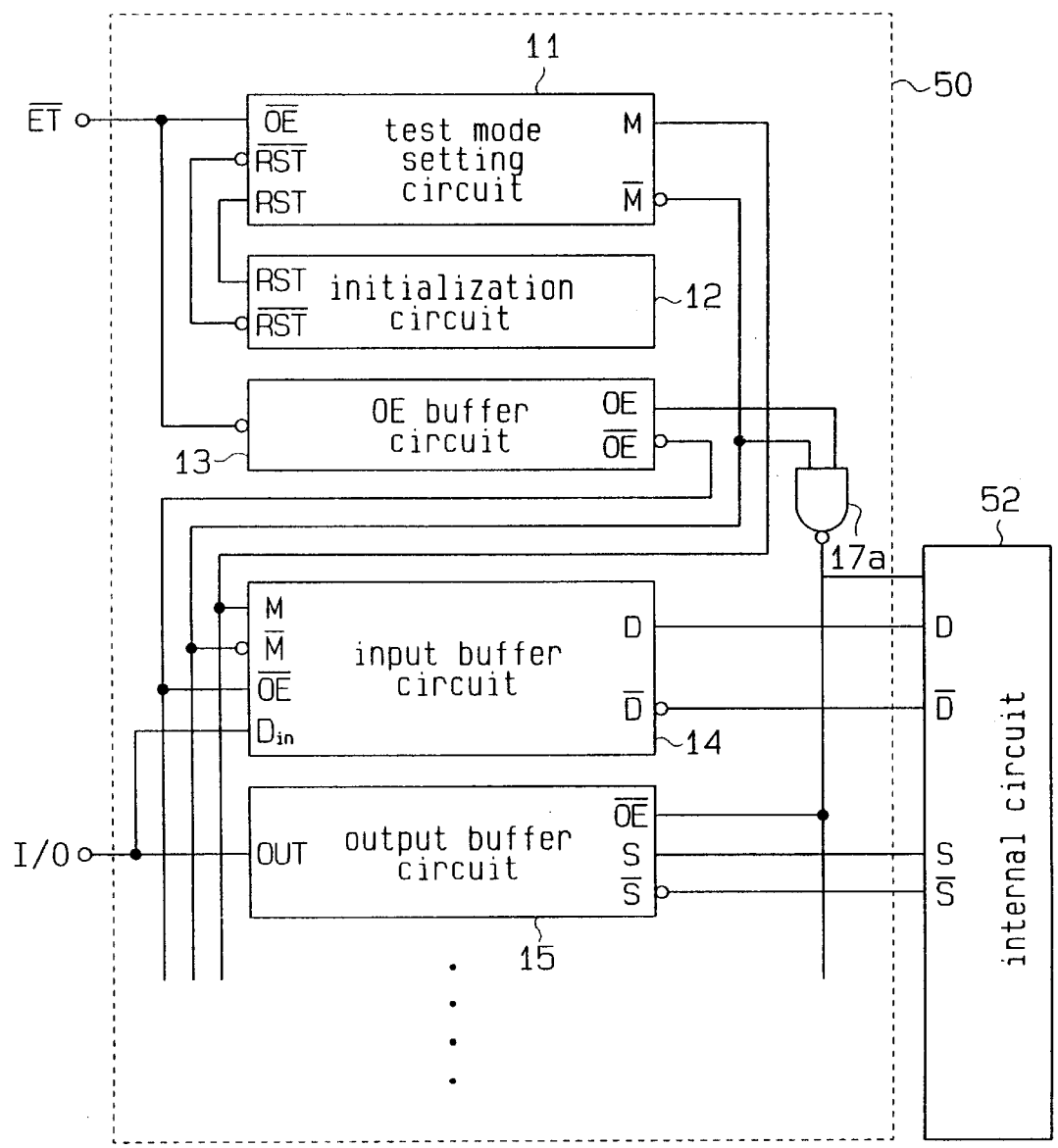
FIG. 5 is a block diagram illustrating a test circuit according to the first embodiment of the invention.

A semiconductor IC device according to the first embodiment of the invention will now be described with reference to the accompanying drawings. In the first embodiment, the invention is adapted to a synchronous DRAM as shown in FIG. 5. This synchronous DRAM has an external terminal /ET, a plurality of input/output terminals I/O, an internal circuit (e.g., memory circuit in this embodiment) 52, and a test circuit 50 connected between the external terminal /ET and the input/output terminals I/O and the internal circuit 52. The test circuit 50 includes a test mode setting circuit 11, an initialization circuit 12, an OE buffer circuit 13, a NAND gate 17a, input buffer circuits 14 and output buffer circuits 15 both associated with the input/output terminals I/O.

When an input signal /OE having a higher voltage level than the normal input voltage range is supplied as a set signal to the external terminal /ET, the test mode is set. In the test mode, the input signal /OE is supplied as write data D and /D to the internal circuit 52 via the OE buffer circuit 13 and each input buffer circuit 14. That is, data input from the input/output terminals I/O of the input buffer circuits 14 is inhibited. Read data S and IS output from the internal circuit 52 are supplied via each output buffer circuit 15 to the associated input/output terminal I/O.

In a normal mode (i.e., non-test mode), each input buffer circuit 14 receives input data Din from the associated input/output terminal I/O and sends this input data as the write data D and /D to the internal circuit 52. Each output buffer circuit 15 receives the read data S and IS output from the internal circuit 52 and supplies the output data to the associated input/output terminal I/O.

Figure 6:
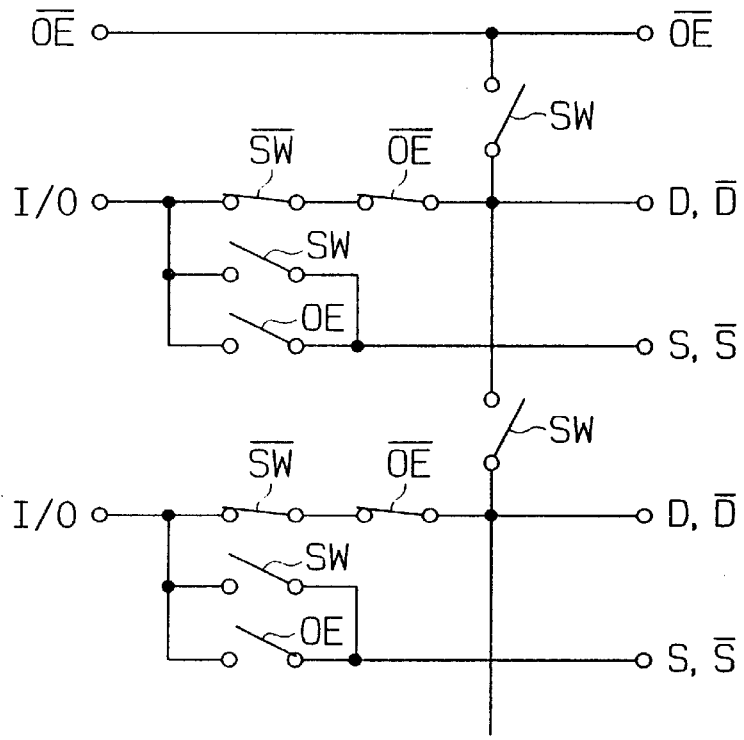
FIG. 6 is a diagram showing an equivalent circuit of the test circuit of FIG. 5.

FIG. 6 shows an equivalent circuit of the test circuit 50. Individual switches SW1 are closed in the test mode and are open in the normal mode. Individual switches /SW are closed in the test mode and are open in the normal mode. Individual switches OE and /OE are alternately open every time the logic level of the input signal OE is inverted.

Test Mode Setting Circuit

Figure 7:
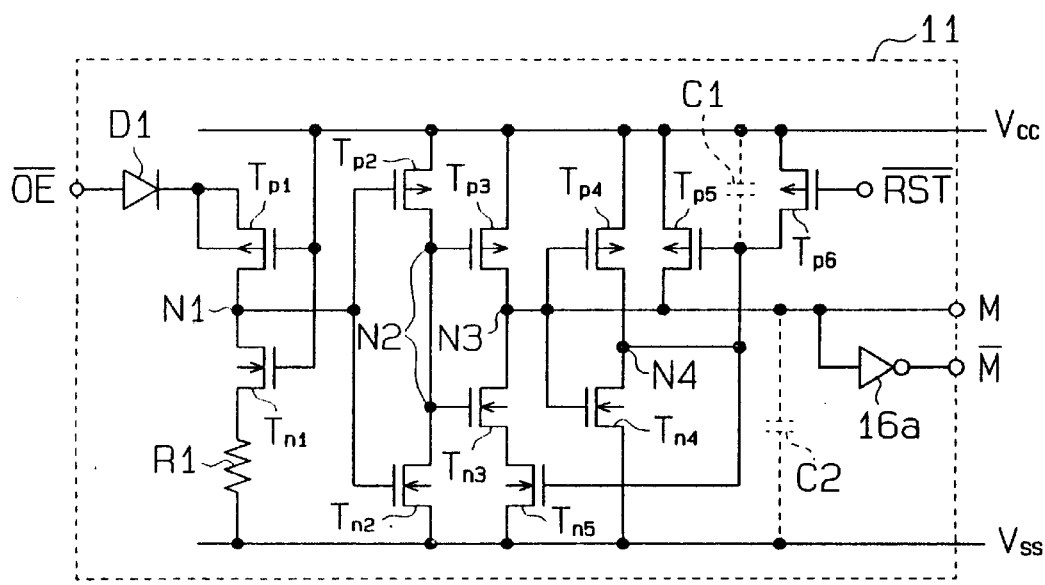
FIG. 7 is a circuit diagram showing a test mode setting circuit included in the test circuit of FIG. 5.

FIG. 7 presents a circuit diagram of the test mode setting circuit 11. A P-channel MOS transistor Tp1 has a source which receives the input signal /OE via a diode D1, a back gate connected to its own source and a high-potential power supply $V_{cc}$, and a drain. An N-channel MOS transistor Tn1 has a drain connected to the drain of the transistor Tp1, a source connected via a resistor R1 to a low-potential power supply $V_{ss}$, and a gate connected to the gate of the transistor Tp1 and the power supply $V_{cc}$.

A P-channel MOS transistor Tp2 has a gate connected to a node N1 between both transistors Tp1 and Tn1, a source connected to the power supply $V_{cc}$, and a drain. An N-channel MOS transistor Tn2 has a gate connected to the node N2, a source connected to the power supply $V_{ss}$, and a drain connected to the drain of the transistor Tp2.

A P-channel MOS transistor Tp3 has a gate connected to a node N2 between both transistors Tp2 and Tn2, a source connected to the power supply $V_{cc}$, and a drain. An N-channel MOS transistor Tn3 has a gate connected to the node N2, a source connected to the power supply $V_{ss}$ via an N-channel MOS transistor Tn5, and a drain connected to the drain of the transistor Tp3.

A P-channel MOS transistor Tp4 has a gate connected to a node N3 between both transistors Tp3 and Tn3, a source connected to the power supply $V_{cc}$, and a drain. An N-channel MOS transistor Tn4 has a gate connected to the node N3, a source connected to the power supply $V_{ss}$, and a drain connected to the drain of the transistor Tp4. The node N3 also serves as the output terminal for a test mode signal M. An inverter 16a connected to the node N3 inverts the logic level of the test mode signal M and outputs a test mode signal /M.

A P-channel MOS transistor Tp5 has a gate connected to a node N4 between both transistors Tp4 and Tn4, a source connected to the power supply $V_{cc}$, and a drain connected to the node N3. A P-channel MOS transistor Tp6 has a drain connected to the node N4, a source connected to the power supply $V_{cc}$ and a gate which receives a reset signal /RST.

The operation of the test mode setting circuit 11 will now be discussed. When supply voltages $V_{cc}$ and $V_{ss}$ are supplied, the reset signal /RST which holds an L level for a given period of time is supplied to the gate of the transistor Tp6. As a result, the transistor Tp6 is turned on to reset the node N4 to an H level, the transistor Tp5 is turned off and the transistor Tn5 is turned on. The transistor Tn1 is turned on as the voltage level of the supply voltage $V_{cc}$ rises, setting the node N1 to an L level. In response to the level transition, the node N2 becomes an H level, causing the transistor Tn3 to be turned on. Accordingly, the test mode signal (output control signal) M which has been reset to an L level is output from the node N3, and the inverter 16a outputs the test mode signal (output control signal) /M which has been reset to an H level.

In the normal mode, the input signal /OE whose amplitude fluctuates between the supply voltage $V_{cc}$ and $V_{ss}$ is supplied as the output control signal to the external terminal /ET. At this time, the source voltage of the transistor Tp1 becomes lower than the gate voltage. The transistor Tp1 therefore maintains the OFF state. The transistor Tn1, when supplied with the power from the power supplies $V_{cc}$ and $V_{ss}$, keeps the ON state. Therefore, the node N1 is kept at the L level. In response to the L-level potential at the node N1, the transistor Tp2 is turned on and the transistor Tn2 is turned off. Consequently, the node N2 becomes an H level, turning off the transistor Tp3 and turning on the transistor Tn3. Further, the transistor Tp4 is turned on, setting the node N4 to the H level. This allows the transistor Tn5 to keep the ON state even when the transistor Tp6 is turned off by the supplied H-level reset signal /RST. Accordingly, the L-level test mode signal M is output from the node N3, and the inverter 16a outputs the H-level test mode signal /M.

To set the test mode, the input signal /OE whose voltage level is higher than the sum of the voltage level of the power supply $V_{cc}$ and both threshold values of the diode D1 and the transistor Tp1 is supplied as the set signal from the external terminal /ET. As a result, the transistor Tp1 is turned on to supply sufficient current to turn on the transistor Tn1, thus setting the node N1 to the H-level. The node N2 becomes an L-level in response to the H-level potential at the node N1, and the node N3 becomes an H-level in response to the L-level potential at the node N2. Further, the node N4 becomes an L-level in response to the H-level potential at the node N3. As a result, the transistor Tp5 is turned on and the transistor Tn5 is turned off. Accordingly, the test mode signal M with the latched H-level is output from the node N3, and the inverter 16a outputs the L-level test mode signal /M. Specifically, the test mode setting circuit 11 has a function to latch the test mode signals M and /M. Once the test mode signal M is set high and the test mode signal /M is set low, therefore, the levels of the test mode signals M and /M are preferably not switched regardless of a level change in the input signal /OE, except when the supply of the supply voltages $V_{cc}$ and $V_{ss}$ is inhibited.

When power is provided, the reset signal /RST that holds an L-level for a given period of time is supplied. The supply of the reset signal /RST resets the node N4 to the H-level and the node N3 to the L-level. As a result, the test mode signals (i.e., output control signals) M and /M associated with the normal mode are output.

When the reset signal /RST is not supplied, a capacitor C1 may be connected between the gate of the transistor Tp5 and the power supply $V_{cc}$ and a capacitor C2 may be connected between the node N3 and the power supply $V_{ss}$ as indicated by the broken lines shown in FIG. 7. Even with this structure, when power is provided, the test mode signals M and /M are reset to signals associated with the normal mode.

Figure 8:
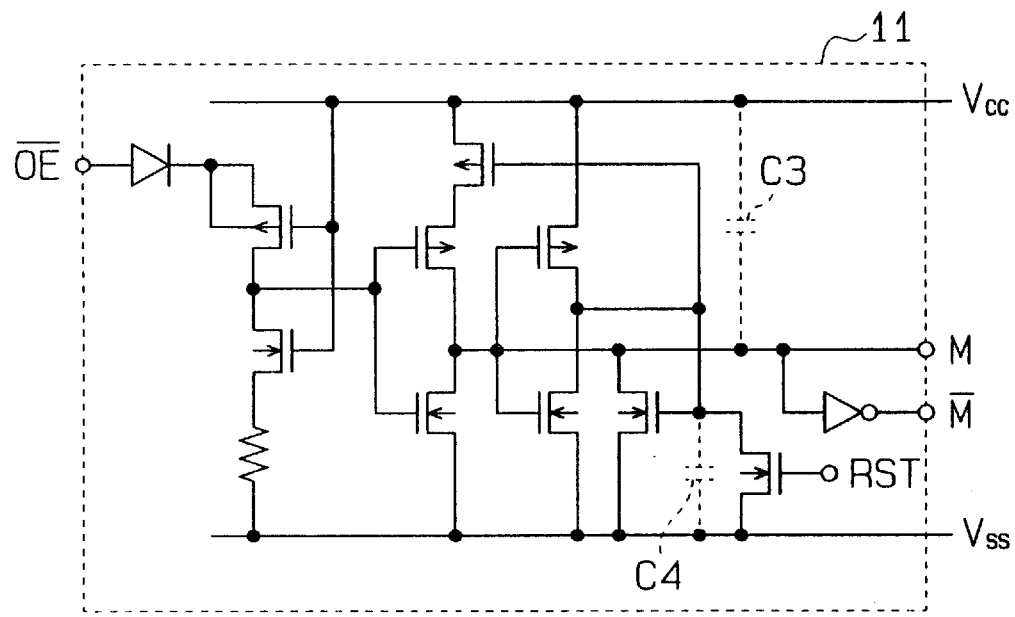
FIG. 8 is a circuit diagram showing another example of the test mode setting circuit.

FIG. 8 illustrates the test mode setting circuit 11 which performs the above-described reset operation in response to the reset signal RST which holds an H-level for a given period of time when power is provided. This test mode setting circuit can output the same test mode signals M and /M as discussed above in response to the input signal /OE. The test mode signals M and /M may be reset to the normal mode signals upon powering on using capacitors C3 and C4 as indicated by the broken lines in the diagram instead of supplying the reset signal RST.

Initialization Circuit

Figure 9:
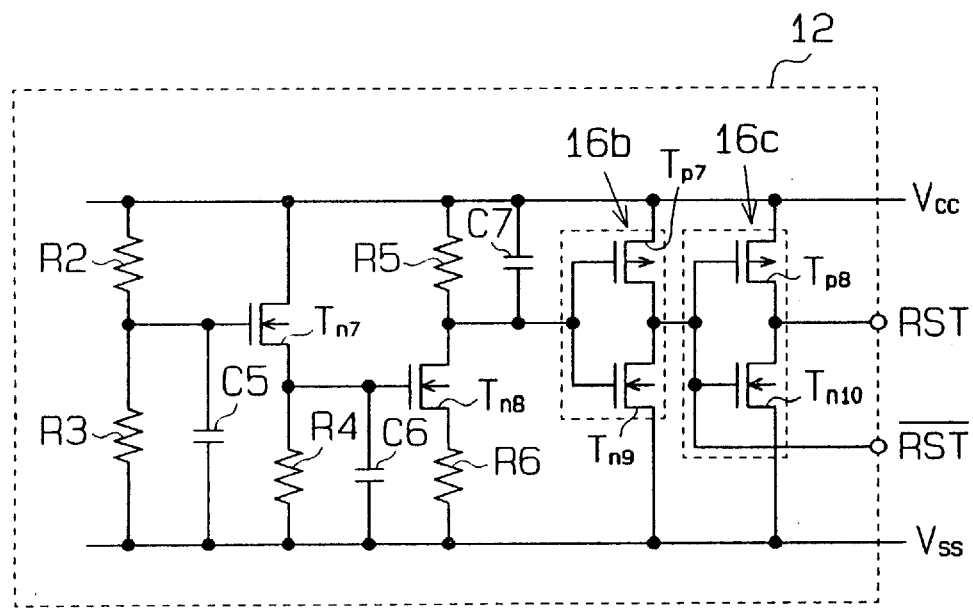
FIG. 9 is a circuit diagram showing an initialization circuit included in the test circuit of FIG. 5.

As shown in FIG. 9, the initialization circuit 12 that supplies the reset signals RST and /RST to the test mode setting circuit 11 has resistors R2 and R3 connected in series between the power supplies $V_{cc}$ and $V_{ss}$. Further, a capacitor C5 is connected in parallel to the resistor R3. An N-channel MOS transistor Tn7 in the test mode setting circuit 11 has a gate connected to the node between the resistors R2 and R3, a drain connected to the power supply $V_{cc}$ and a source connected via a resistor R4 to the power supply $V_{ss}$. Also shown is a capacitor C6 being connected in parallel to the resistor R4.

An N-channel MOS transistor Tn8 has a gate connected to the source of the transistor Tn7, a drain connected via a resistor R5 to the power supply $V_{cc}$ and a source connected via a resistor R6 to the power supply $V_{ss}$. Further, a capacitor C7 is connected in parallel to the resistor R5. An inverter 16b, which comprises a P-channel MOS transistor Tp7 and an N-channel MOS transistor Tn9, has an input terminal connected to the drain of the transistor Tn8 and an output terminal for outputting the reset signal /RST. An inverter 16c, which comprises a P-channel MOS transistor Tp8 and an N-channel MOS transistor Tn10, has an input terminal connected to the output terminal of the inverter 16b and an output terminal for outputting the logic-inverted reset signal RST.

When the supply voltages $V_{cc}$ and $V_{ss}$ are supplied, first, the voltage at the input terminal of the inverter 16b rises quickly via the resistor R5 and the capacitor C7 and the L-level reset signal /RST is output from the output terminal of the inverter 16b. The H-level reset signal RST is output from the output terminal of the inverter 16c.

The time for the gate voltage of the transistor Tn7 to rise to the level of the supply voltage $V_{cc}$ is delayed in accordance with the time constant that is determined by the resistors R2 and R3 and the capacitor C5. The transistor Tn7 is therefore turned on after the time-constant dependent delay time passes. The time for the gate voltage of the transistor Tn8 to rise to the level of the supply voltage $V_{cc}$ after the transistor Tn7 has been turned on is delayed in accordance with the time constant that is determined by the resistor R4 and the capacitor C6. The transistor Tn8 is therefore turned on after that delay time passes. The time for the input voltage to the inverter 16b to drop to the level of the supply voltage $V_{ss}$ after the transistor Tn8 has been turned on is delayed in accordance with the time constant that is determined by the resistor R5 and the capacitor C7. Accordingly, the inverter 16b outputs the H-level reset signal /RST after that delay time elapses. The inverter 16c outputs the L-level reset signal RST. As apparent from the above, when the supply voltages $V_{cc}$ and $V_{ss}$ are supplied, the initialization circuit 12 outputs the H-level reset signal RST and the L-level reset signal /RST and outputs the L-level reset signal RST and the H-level reset signal /RST after the aforementioned three delay times elapse.

Referring again to FIG. 5, the OE buffer circuit 13 has an input terminal for receiving the input signal /OE and output terminals for outputting the output control signals OE and /OE. The output control signal OE is supplied to the NAND gate 17a and the output control signal /OE is supplied to the individual input buffer circuits 14.

Input Buffer Circuit

Each input buffer circuit 14 has four input terminals for respectively receiving the test mode signals M and /M, input data Din supplied from the associated input/output terminal I/O and the output control signal /OE, and two output terminals for respectively supplying write data D and /D associated with the input data Din.

Figure 10:
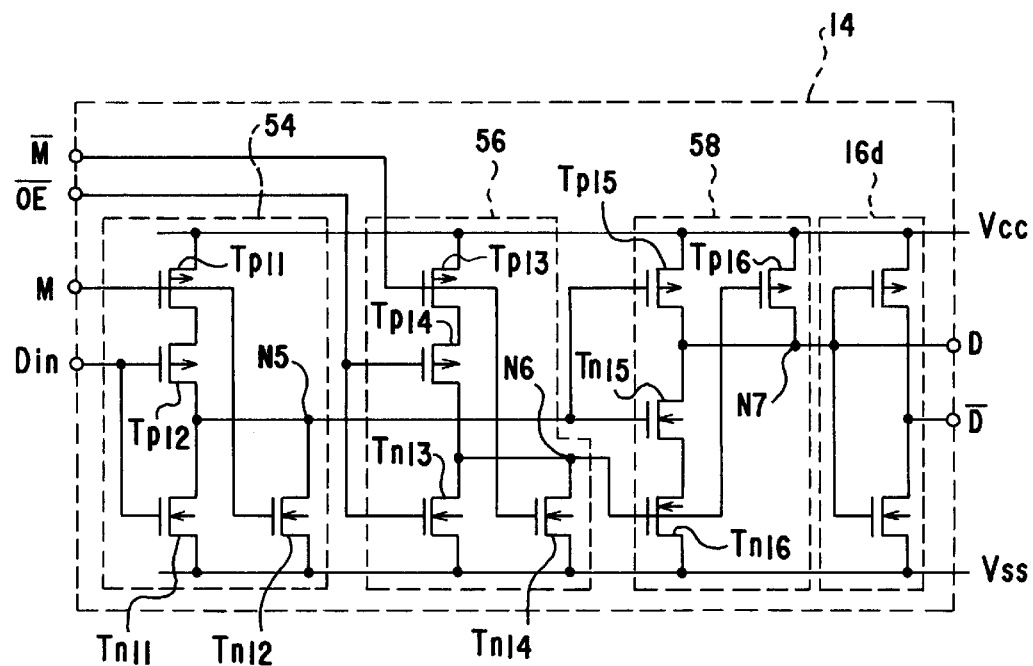
FIG. 10 is a circuit diagram depicting an input buffer circuit included in the test circuit of FIG. 5.

As shown in FIG. 10, each input buffer circuit 14 has a first NOR gate 54, which comprises P-channel MOS transistors Tp11 and Tp12 and N-channel MOS transistors Tn11 and Tn12. This first NOR gate 54 outputs an H-level output signal from a node N5 (output terminal) when receiving the L-level test mode signal M and the L-level input data Din. The input buffer circuit 14 further has a second NOR gate 56, which comprises P-channel MOS transistors Tp13 and Tp14 and N-channel MOS transistors Tn14 and Tn14. The second NOR gate 56 outputs an H-level output signal from a node N6 (output terminal) when receiving the L-level test mode signal /M and the L-level output control signal /OE.

This input buffer circuit 14 further includes a NAND gate 58, which comprises P-channel MOS transistors Tp15 and Tp16 and N-channel MOS transistors Tn15 and Tn16, and an inverter 16d. The NAND gate 58 outputs an L-level output signal as write data D from a node N7 (output terminal) when receiving the H-level output signals from the nodes N5 and N6. The inverter 16d receives the write data D, inverts the logic level thereof, and outputs the resultant write data /D.

The input buffer circuit 14 therefore outputs complementary signals, associated with the input data Din from the associated input/output terminal I/O, as the write data D and /D in response to the L-level test mode signal M and the H-level test mode signal /M. The input buffer circuit 14 also outputs complementary signals, associated with the output control signal /OE as the write data D and /D in response to the H-level test mode signal M and the L-level test mode signal /M.

Operation of Test Circuit

When supplied with the supply voltages $V_{cc}$ and $V_{ss}$, the test mode setting circuit 11 outputs the L-level test mode signal M and the H-level test mode signal /M in response to the reset signals RST and /RST output from the initialization circuit 12.

In the normal mode, the test mode setting circuit 11 keeps outputting the L-level test mode signal M and the H-level test mode signal /M when receiving the input signal /OE of the normal level as the output control signal. In this manner, the input buffer circuits 14 and the output buffer circuits 15 are controlled by the output control signal /OE. This control can be explained with the equivalent circuit which is shown in FIG. 6. The individual switches /SW are closed, and the individual switches SW are open. One of each switch OE and each switch /OE is closed in response to the output control signal /OE. In the write mode, therefore, the input buffer circuits 14 receive the input data Din supplied from the associated input/output terminals I/O and supply this data as the write data D and /D to the internal circuit 52. In the read mode, the output buffer circuits 15 receive the read data S and /S from the internal circuit 32 and outputs the received data to the associated input/output terminals I/O.

In the test mode, the input signal /OE whose voltage level is higher than the sum of the voltage level of the power supply $V_{cc}$ and both threshold values of the diode D1 and the transistor Tp1 is supplied as the set signal to the external terminal /ET. As a result, the test mode setting circuit 11 outputs the H-level test mode signal M and the L-level test mode signal /M. Consequently, the individual switches SW in the equivalent circuit in FIG. 6 are closed and the individual switches /SW are open. Accordingly, the input buffer circuits 14 receive the input signal /OE coming from the external terminal /ET and supplies this signal as the write data D and /D to the internal circuit 52, while the output buffer circuits 15 receives the read data S and /S coming from the internal circuit 52 and supplies the data to the associated input/output terminals I/O.

As discussed above, the test mode setting circuit 1 sets the test mode in response to the input signal /OE which has a predetermined high voltage level. In this test mode, the input signal /OE from the external terminal /ET is supplied as the write data D and /D to the internal circuit 52 via the input buffer circuits 14, and the read data S and /S are supplied to the associated input/output terminals I/O via the associated output buffer circuits 15. That is, the external terminal /ET is used as an input terminal and the input/output terminals I/O are used as output terminals in the test mode. It is therefore possible to conduct an "operation test" while keeping the input terminals and the output terminals independent of each other. Further, the operation test can advantageously be carried out without using cables. Those features can therefore overcome the above described conventional problems associated with signal delays originating from the use of cables provided between the test device and a semiconductor device. In addition, the above described embodiments allow an operation test to be performed for a semiconductor IC device that operates at high frequencies, even after the semiconductor IC device is packaged.

When the test mode is disabled and the normal mode is set, the write data D and /D from the input/output terminals I/O are supplied to the internal circuit 52, and the read data S and /S are supplied to the input/output terminals I/O. In other words, the input/output terminals I/O are used as input terminals and output terminals when in the normal mode.

Test Mode Setting Circuit (Modification)

Figure 11:
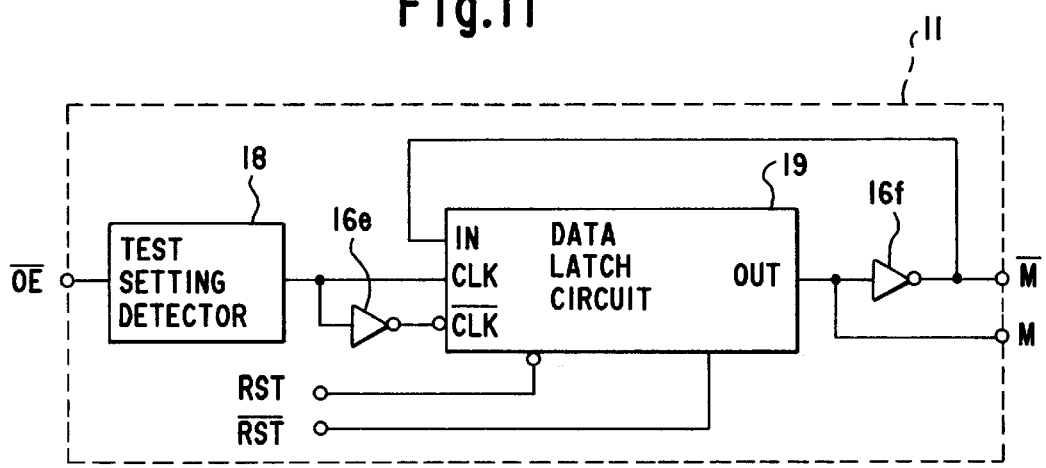
FIG. 11 is a circuit diagram showing a test mode setting circuit according to a modification.

As shown in FIG. 11, the test mode setting circuit 11 according to a modification has a test setting detector 18, a data latch circuit 19 and two inverters 16e and 16f. The test setting detector 18 receives the input signal /OE and supplies the output signal as a clock signal CLK to the data latch circuit 19 and the inverter 16e. The inverter 16e receives the clock signal CLK and supplies a clock signal /CLK to the data latch circuit 19.

The data latch circuit 19 sends out an output signal OUT as the test mode signal M. The inverter 16f receives the test mode signal M and outputs the test mode signal /M. The data latch circuit 19 receives the test mode signal /M as an input signal IN from the inverter 16f.

Figure 12:
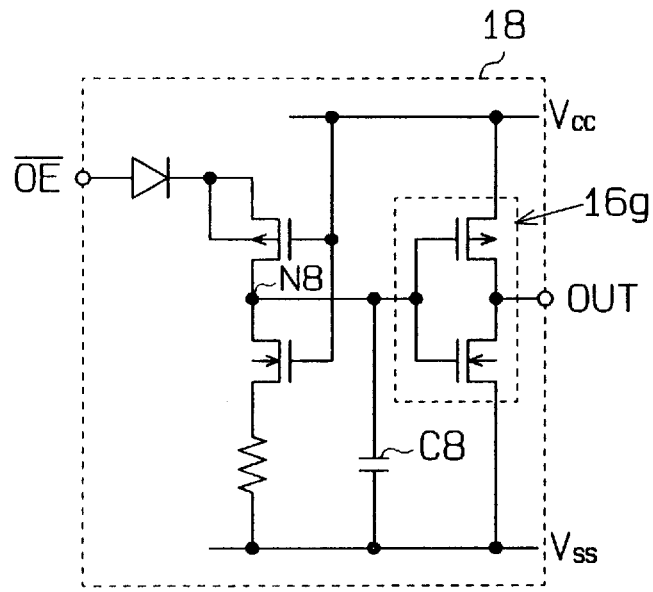
FIG. 12 is a circuit diagram illustrating a first example of a test setting detector included in the test mode setting circuit of FIG. 11.

FIG. 12 illustrates a first example of the test setting detector 18. This test setting detector 18 has an input section with the same structure as the input section (the diode D1, the transistors Tp1 and Tn1 and the resistor R1) of the test mode setting circuit shown in FIG. 7. When the input signal /OE whose voltage level is higher than that of the supply voltage $V_{cc}$ is supplied as the test setting signal, the voltage at a node N8 in the input section rises. The node N8 is connected via a capacitor C8 to the power supply $V_{ss}$. An inverter 16g has an input terminal connected to the node N8 and an output terminal from which the output signal OUT is sent out.

When the input signal /OE of the normal level is supplied in the normal mode, the node N8 becomes an L level and the test setting detector 18 outputs the H-level output signal OUT. When the input signal /OE with a high voltage level greater than that of the supply voltage $V_{cc}$ is supplied as the test setting signal in the test mode, the node N8 becomes an H level and the test setting detector 18 outputs the L-level output signal OUT. At this time, the capacitor C8 operates in such a manner that a voltage variation at the node N8 caused by noise mixed in the input signal /OE is suppressed and a stable output signal OUT is sent out.

Figure 13:
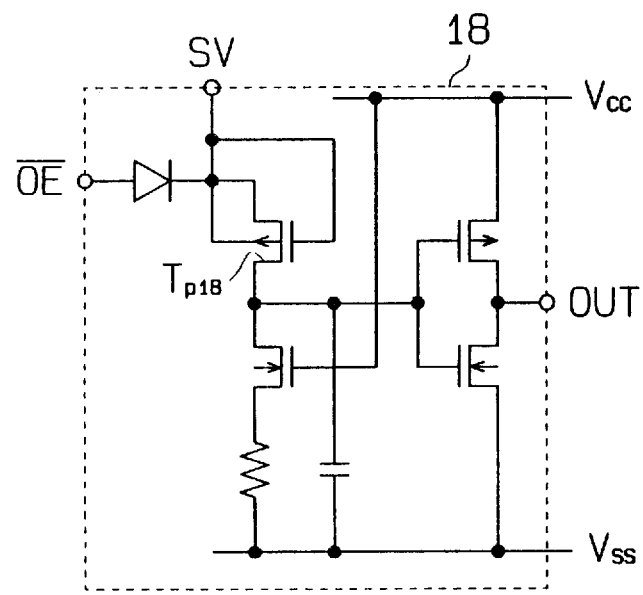
FIG. 13 is a circuit diagram of a second example of the test setting detector.

FIG. 13 shows a second example of the test setting detector 18. A P-channel MOS transistor Tp18 in the input section included in this detector 18 has a source and a back gate both connected to a power supply SV different from the power supply $V_{cc}$. The transistor Tp18 is turned on in response to the input signal /OE whose voltage level is higher than the supply voltage SV by a predetermined value. Properly setting the supply voltage VS, therefore, increases the degree of freedom in selecting the level of the input signal /OE which can turn on the transistor Tp18.

Figure 14:
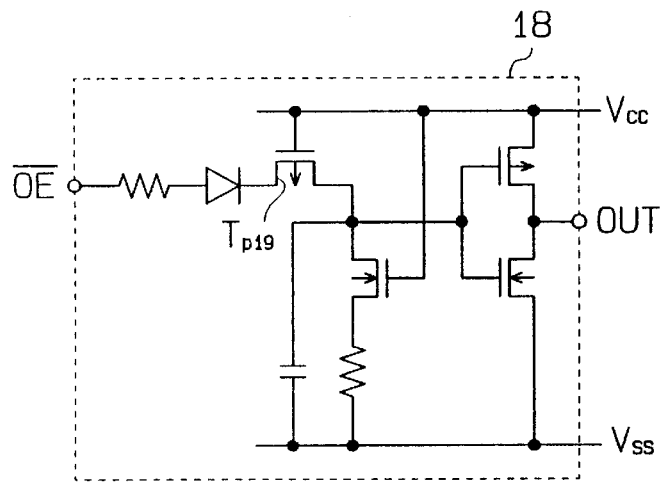
FIG. 14 is a circuit diagram of a third example of the test setting detector.

FIG. 14 shows a third example of the test setting detector 18. A P-channel MOS transistor Tp19 included in this detector 18 has a gate connected to the power supply $V_{cc}$ and a source for receiving the input signal /OE via a resistor and a diode. This P-channel MOS transistor Tp19 further has a base parasitic to the back gate and an emitter parasitic to the source. In other words, the transistor Tp19 has a parasitic bipolar transistor. When the potential difference between the base and emitter increases, therefore, the drain current flows through the transistor Tp19. The flow of the drain current permits the third example of the test setting detector 18 to function in substantially the same way as the first and second examples.

Figure 15:
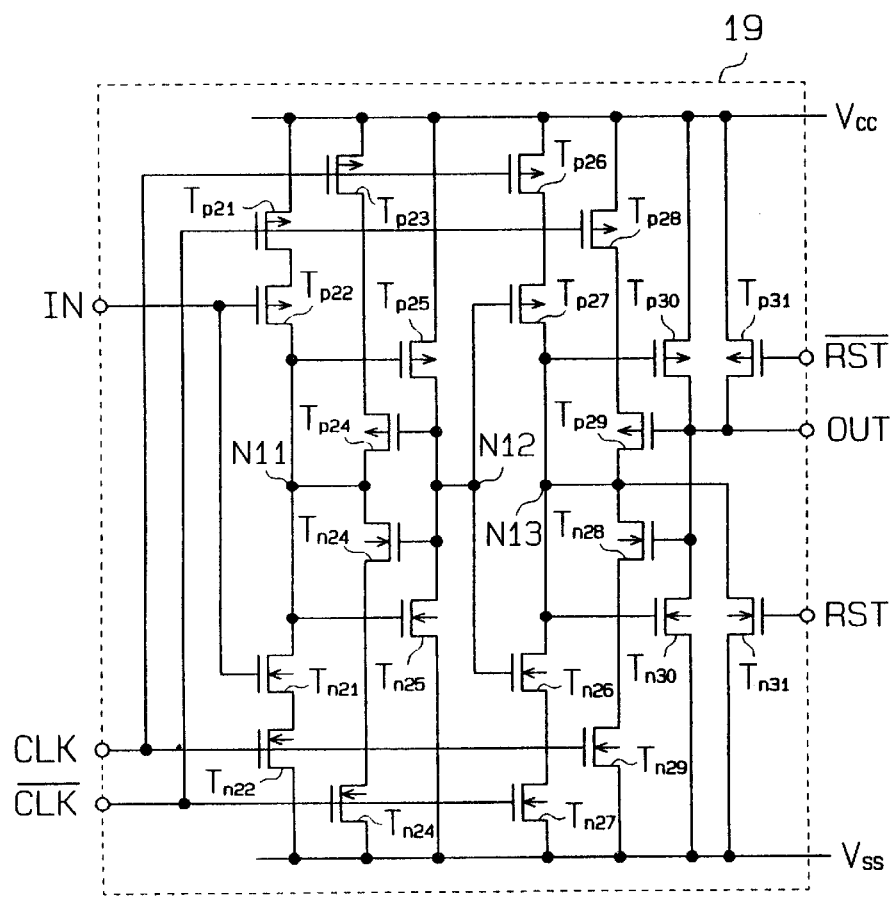
FIG. 15 is a circuit diagram showing a first example of a data latch circuit included in the test mode setting circuit of FIG. 11.

FIG. 15 shows a first example of the data latch circuit 19. This data latch circuit 19 inverts the logic level of the output signal OUT every time the level of the clock signal CLK is inverted to the L level from the H level and the level of the clock signal /CLK is inverted to the H level from the L level. This data latch circuit 19 has an N-channel MOS transistor Tn31 and a P-channel MOS transistor Tp31. Upon reception of power from the power supply, the transistor Tn31 is turned on in response to the H-level reset signal RST and the transistor Tp31 is turned on in response to the L-level reset signal /RST. Through the actions of those transistors Tn31 and Tp31, the data latch circuit 19 sends out the H-level output signal OUT and receives the L-level input signal IN via the inverter 16f. The data latch circuit 19 also receives the H-level clock signal CLK and the L-level clock signal /CLK as initial values from the test setting detector 18 and the inverter 16e.

P-channel MOS transistors Tp21 and Tp22 in the data latch circuit 19 are turned on in response to the L-level input signal IN, and a node N11 between both transistors becomes an H level and a node N12 becomes an L level.

Then, a P-channel MOS transistor Tp23 is turned on in response to the clock signal CLK whose level has been inverted to the L level, and the nodes N11 and N12 are respectively latched to the H level and the L level. A P-channel MOS transistor Tp26 is turned on in response to the L-level clock signal CLK, and a P-channel MOS transistor Tp27 is turned on by the voltage at the L-level node N12. This sets a node N13 to an H level and turns on an N-channel MOS transistor Tn30. Consequently, the data latch circuit 19 sends out the L-level output signal OUT and receives the H-level input signal IN.

Next, an N-channel MOS transistor Tn22 is turned on in response to the clock signal CLK whose level has been inverted to the H level from the L level, and the P-channel MOS transistor Tp21 is turned on in response to the clock signal /CLK whose level has been inverted to the L level from the H level. Consequently, the node N11 becomes an L level and the node N12 becomes an H level. An N-channel MOS transistor Tn27 is turned off in response to the L-level clock signal /CLK, and P-channel MOS transistors Tp28 and Tp29 have already been turned on. Accordingly, the node N13 is kept at the H level.

When the level of the clock signal CLK is inverted to the L level from the H level and the level of the clock signal /CLK is inverted to the H level from the L level, the potential level at the node N13 is inverted to the L level. Consequently, the data latch circuit 19 outputs the output signal OUT whose level has been inverted to the H level.

Figure 16:
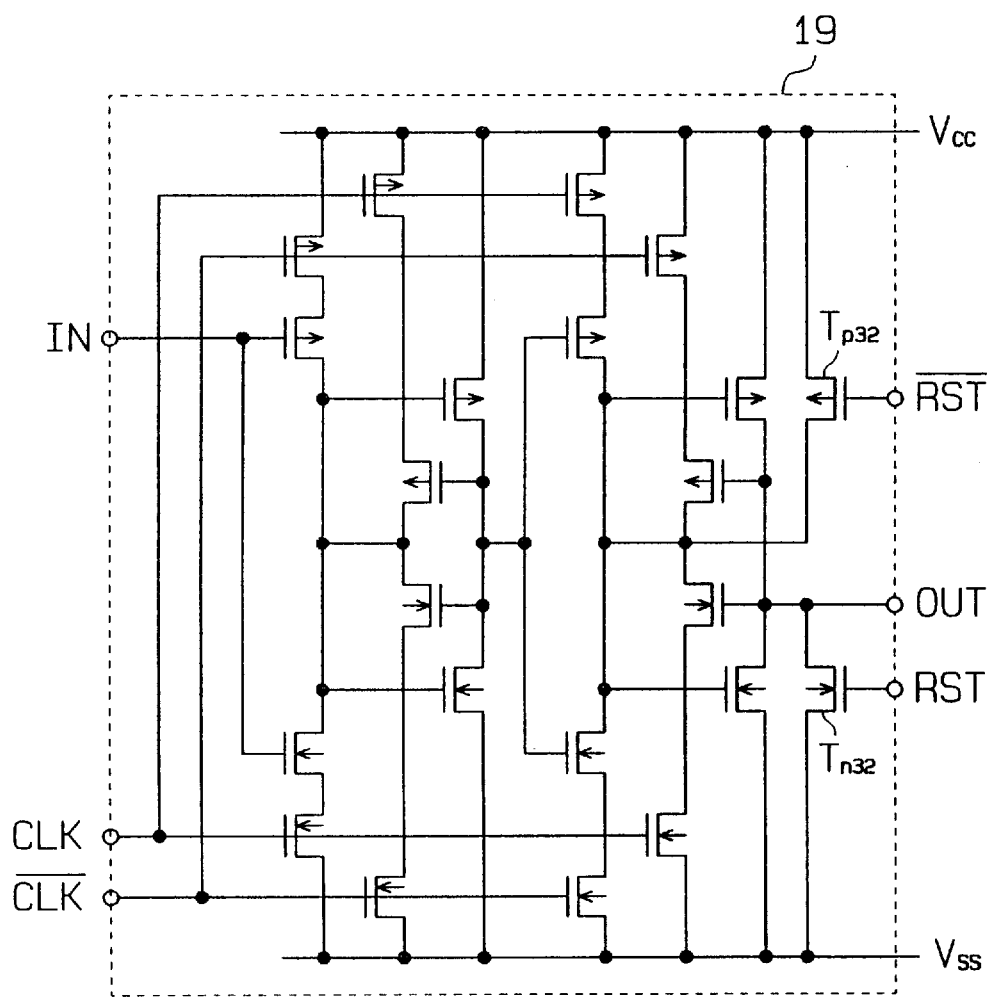
FIG. 16 is a circuit diagram showing a second example of the data latch circuit.

FIG. 16 shows a second example of the data latch circuit 19. This data latch circuit 19 includes a P-channel MOS transistor Tp32 which receives the reset signal RST and an N-channel MOS transistor Tn32 which receives the reset signal /RST, and can reset the output signal OUT to the L level. The transistor structure other than those two transistors is substantially the same as the first example of the data latch circuit.

The test setting detector 18 preferably supplies the L-level clock signal CLK and the H-level clock signal /CLK to the data latch circuit 19 when receiving the input signal /OE having a predetermined high voltage level. In response to those clock signals CLK and /CLK, the data latch circuit 19 inverts the logic level of the output signal OUT. Therefore, the test mode setting circuit 11 preferably inverts the logic levels of the test mode signals M and /M when receiving the input signal /OE of a predetermined level. This inversion allows the test mode and the normal mode to be advantageously selected in the alternative. The test mode setting circuit 11 according to this modification, unlike the test mode setting circuit shown in FIG. 7, can switch the mode between the "test mode" and the "normal mode" without inhibiting the power supply.

Second Embodiment

Figure 17:
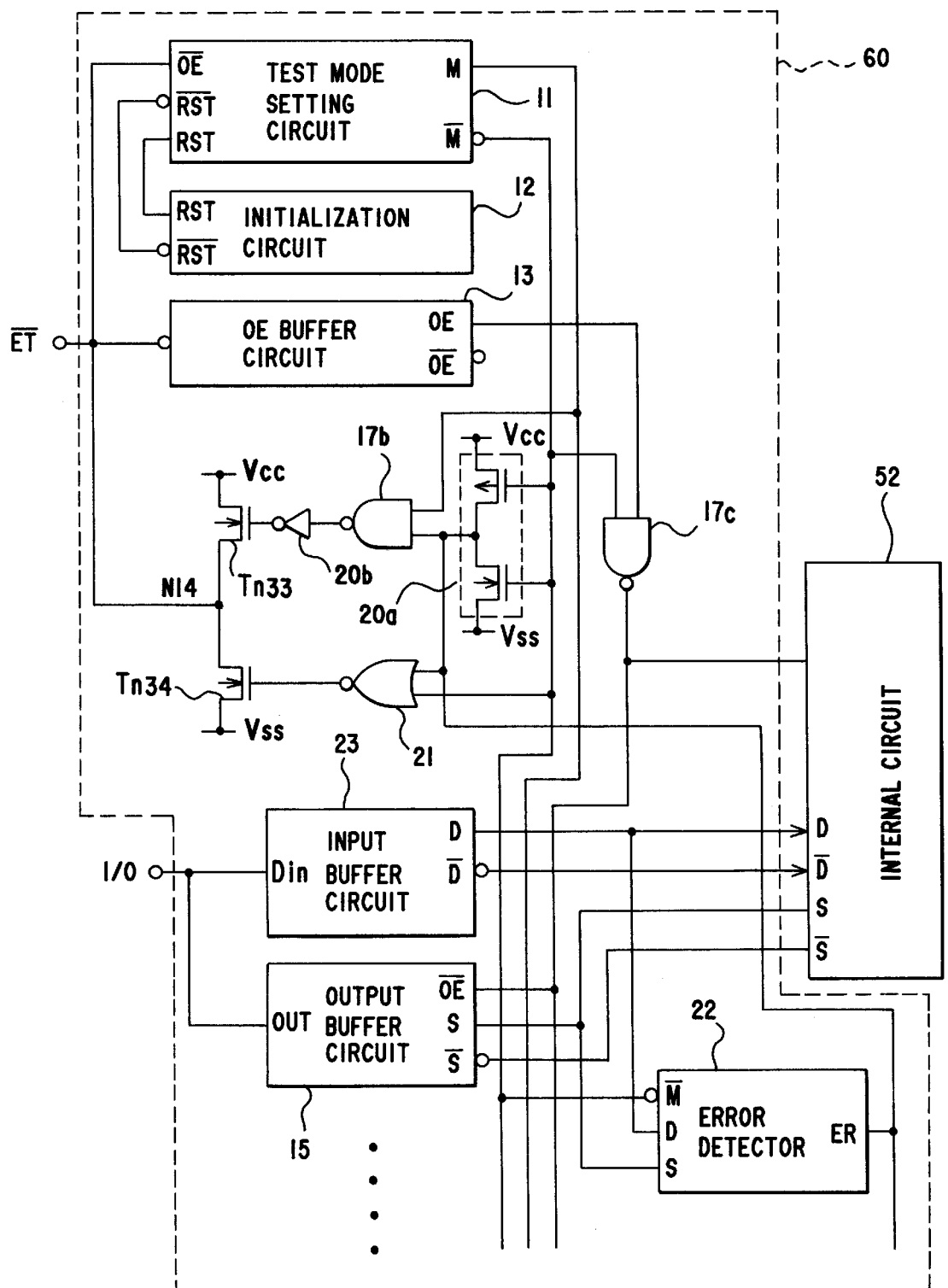
FIG. 17 is a block diagram illustrating a test circuit according to the second embodiment of the invention.

The second embodiment of the invention will be now described with reference to the accompanying drawings. To avoid a redundant description, like or same reference numerals are given to those components which are the same as the corresponding components of the first embodiment. As sown in FIG. 17, a test circuit 60 according to the second embodiment has the test mode setting circuit 11, the output buffer circuits 15, the initialization circuit 12, an OE buffer circuit 13, NAND gates 17b and 17c, an upload circuit (inverter) 20a, an inverter 20b, a NOR gate 21, an error detector 22, input buffer circuits 23 and N-channel MOS transistors Tn33 and Tn34. According to the second embodiment, the input/output terminals I/O are used as input terminals for receiving the input data Din and the external terminal /ET is used as the output terminal for outputting the test result in the test mode. In the normal mode, the external terminal /ET is used to receive the output control signal /OE as the input signal.

The test circuit 60 sets the test mode upon reception of the input signal /OE which has a predetermined high voltage level. In the test mode, the internal circuit 52 receives the input data Din from the input/output terminals I/O and performs writing and reading operations. The error detector 22 detects if the write data D coincides with the read data S, and supplies an L-level error detection signal ER to the external terminal /ET when they do not coincide. In the normal mode, the test circuit 60 operates in such a way that the write data D and /D are supplied to the internal circuit 52 from the input/output terminals I/O and the read data S and /S are supplied to the input/output terminals I/O from the internal circuit 52.

Figure 18:
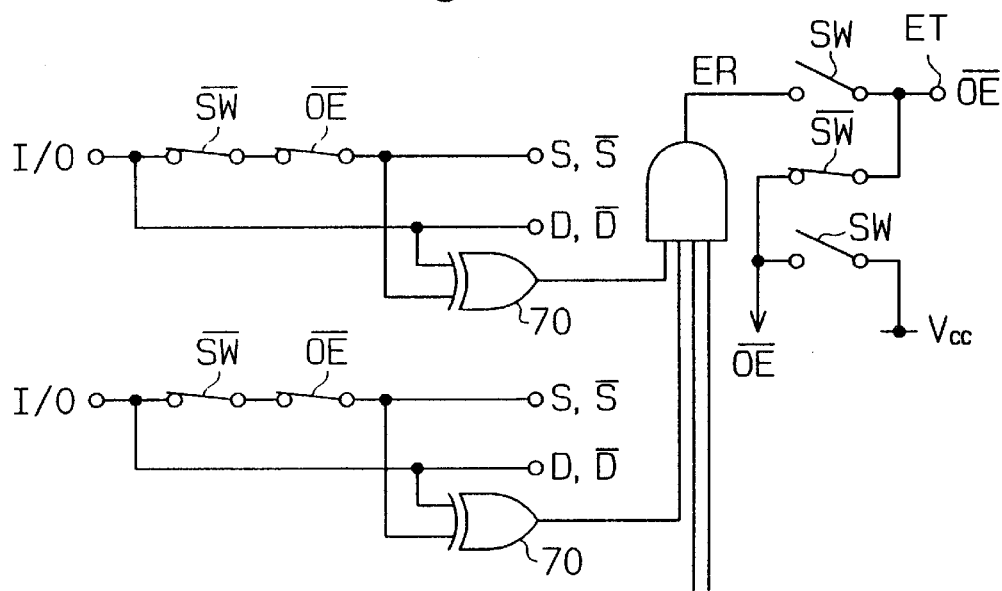
FIG. 18 is a diagram showing an equivalent circuit of the test circuit of FIG. 17.

FIG. 18 shows an equivalent circuit of the test circuit 60 according to the second embodiment. In the test mode, the individual switches SW are closed and the individual switches /SW are opened. The individual switches /OE are opened or closed in response to the output control signal /OE.

Referring again to FIG. 17, as shown, the test mode signal M is supplied to the first input terminal of the NAND gate 17b. The test mode signal /M is supplied to the upload circuit 20a for the error detector 22, the first input terminal of the NOR gate 21 and the error detector 22. The upload circuit 20a supplies the output signal to the second input terminal of the NAND gate 17b and the second input terminal of the NOR gate 21. The output signal of the NAND gate 17b has its level inverted by the inverter 20b and is then supplied to the N-channel MOS transistor Tn33. The transistor Tn33 has a gate for receiving the signal which is output from the inverter 20b, a drain connected to the power supply $V_{cc}$ and a source. The N-channel MOS transistor Tn34 has a gate for receiving the output signal of the NOR gate 21, a drain connected to the source of the transistor Tn33 and a source connected to the power supply $V_{ss}$. The transistor Tn33 may be replaced with a P-channel MOS transistor and the inverter 20b may be omitted. A node N14 between both transistors Tn32 and Tn33 is connected to the external terminal /ET.

The NAND gate 17c has a first input terminal to which the output signal OE of the OE buffer circuit 13 is input and a second input terminal to which the test mode signal M is input. The NAND gate 17c sends the output signal to the individual output buffer circuits 15 provided in association with the input/output terminals I/O.

The input buffer circuits 23 receive the input data Din from the associated input/output terminals I/O and supplies this data as write data D and /D to the internal circuit 52. The input buffer circuits 23 also supply the write data D to the error detector 22.

The internal circuit 52 supplies read data S and /S to the output buffer circuits 15 and supplies the read data S to the error detector 22. The error detector 22 is provided in association with the individual input/output terminals I/O, and supplies the output signal ER to the output terminal of the upload circuit 20a and the second input terminal of the NOR gate 21. When the level of the write data D differs from the level of the read data S in the test mode, the error detector 22 outputs the L-level output signal ER.

Error Detector

Figure 19:
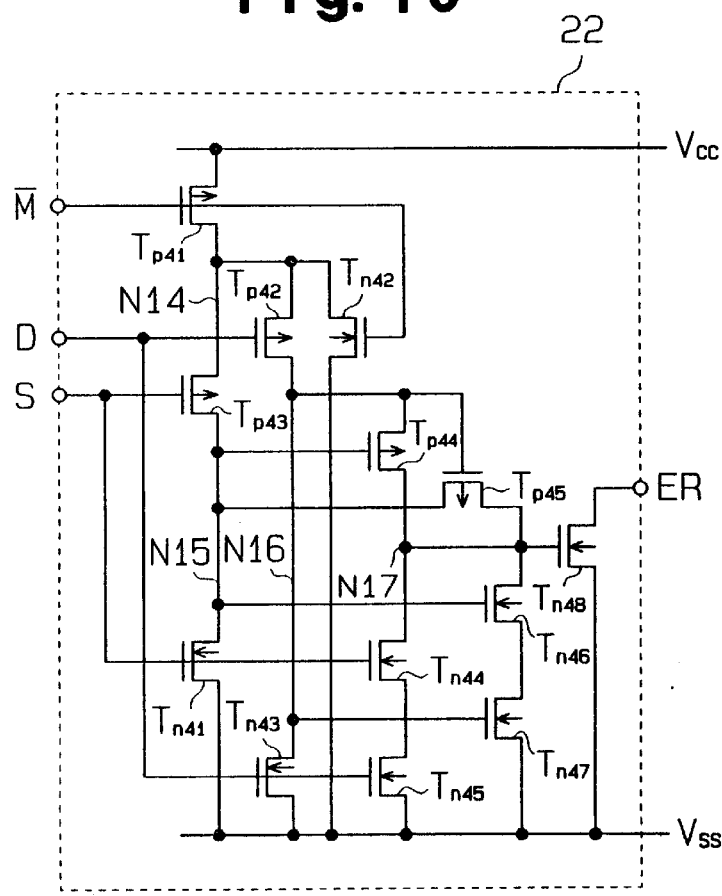
FIG. 19 is a circuit diagram showing an error detector included in the test circuit of FIG. 17.

As shown in FIG. 19, a P-channel MOS transistor Tp41 in the error detector 22 has a gate for receiving the test mode signal /M, a source connected to the power supply $V_{cc}$ and a drain. An N-channel MOS transistor Tn42 has a gate, which receives the test mode signal /M and is connected to the gate of the transistor Tp41, a drain connected to the drain (node N14) of the transistor Tp41, and a source connected to the power supply $V_{ss}$.

A P-channel MOS transistor Tp42 has a gate for receiving the write data D, a source connected to the node N14, and a drain. An N-channel MOS transistor Tn43 has a gate, which receives the write data D and is connected to the gate of the transistor Tp42, a drain connected to the drain (node N16) of the transistor Tp42, and a source connected to the power supply $V_{ss}$.

A P-channel MOS transistor Tp43 has a gate for receiving the read data S, a source connected to the node N14, and a drain connected to the power supply $V_{ss}$ via a P-channel MOS transistor Tp44 and N-channel MOS transistors Tn44 and Tn45. An N-channel MOS transistor Tn41 has a gate, which receives the read data S and is connected to the gate of the transistor Tp43, a drain connected to the drain (node N15) of the transistor Tp41, and a source connected to the power supply $V_{ss}$.

The transistor Tp44 has a gate connected to the node N15, a source connected to the node N16, and a drain. The drain (node N17) of the transistor Tp44 is connected to the power supply $V_{ss}$ via the transistors Tn44 and Tn45. The transistor Tn44 has a gate for receiving the read data S. The transistor Tn45 has a gate for receiving the write data D.

A P-channel MOS transistor Tp45 has a gate connected to the node N16, a drain connected to the node N15, and a source connected to the power supply $V_{ss}$ via N-channel MOS transistors Tn46 and Tn47. The transistor Tn46 has a gate connected to the node N15. The transistor Tn47 has a gate connected to the node N16.

An N-channel MOS transistor Tn48 has a gate connected to the node N17 and also connected via the transistors Tn46 and Tn47 to the power supply $V_{ss}$, a source connected to power supply $V_{ss}$ and a drain from which the output signal ER is output. The gate of the transistor Tn48 is also connected to the node N15 via the transistor Tp45.

In the normal mode, the transistor Tp41 is turned off in response to the H-level test mode signal /M, and the transistor Tn42 is turned on, setting the node N14 to an L level. The write data D and the read data S whose logic levels have been inverted set all of the nodes N15, N16 and N17 to L levels, turning off the transistor Tn48. As a result, the drain of the transistor Tn48 in the error detector 22 goes to a high-impedance state (where the output signal ER becomes unstable).

In the test mode, the transistor Tp41 is turned on in response to the L-level test mode signal M, and the transistor Tn42 is turned off, setting the node N14 to an H level. When the write data D and the read data S both of H levels or L levels are received under this situation, the nodes N15 and N16 are both set to L levels or H levels. The node N17 becomes an L level, thus turning off the transistor Tn48. Accordingly, the output signal ER becomes unstable.

When the write data D and the read data S one of which has an H level while the other has an L level are supplied in the test mode, one of the nodes N15 and N16 becomes an H level and the other node becomes an L level. The node N17 becomes an H level, so that the transistor Tn48 is turned on. Consequently, the error detector 2 outputs the L-level output signal ER from the drain of the transistor Tn48.

The size of the transistor Tn48 is designed to be sufficiently larger than the transistors included in the upload circuit 20a. This design forcibly sets the level of the output signal of the upload circuit 20a to an L level when the L-level output signal ER is output.

Operation of Test Circuit

In the normal mode, the NAND gate 17c receives the H-level test mode signal /M and the output control signal /OE supplied at the external terminal /ET, and supplies an output signal in phase with that output control signal /OE to the internal circuit 52 and the output buffer circuits 15. The internal circuit 52 and the output buffer circuits 15 set the write mode or the read mode in accordance with the output control signal /OE.

The NAND gate 17b receives the L-level output signal from the upload circuit 20a and the L-level test mode signal M and outputs an H-level output signal. As a result, an L-level output signal is sent out from the inverter 20b. The NOR gate 21 sends out an L-level output signal. In response to the L-level output signals, the transistors Tn33 and Tn34 are both turned off, setting the node N14 to a high-impedance state. The output signal ER of the error detector 22 is also in a high-impedance state.

In the normal mode, the individual switches SW in the equivalent circuit shown in FIG. 18 are opened and the individual switches /SW are closed. When the write mode is set in response to the output control signal /OE, the input buffer circuits 23 receive the input data Din supplied at the associated input/output terminals I/O and supply the data as write data D and /D to the internal circuit 52. When the read mode is set, the output buffer circuits 15 receive the read data S and /S read from the internal circuit 52 and supply the data as output data to the associated input/output terminals I/O.

In the test mode, the NAND gate 17c receives the L-level test mode signal /M and the output control signal OE and supplies its output signal which is normally fixed to an H level to the internal circuit 52 and the output buffer circuits 15. Consequently, the output buffer circuits 15 become disabled to stop their operations. The error detector 22 is enabled in response to the L-level test mode signal /M. The NAND gate 17b sends out an L-level output signal in response to the H-level output signal of the upload circuit 20a and the H-level test mode signal M. The transistor Tn33 is turned on in response to the H-level output signal which has been inverted by the inverter 20b. The NOR gate 21 outputs an L-level output signal so that the transistor Tn34 is turned off. Therefore, the node N14 becomes an H level.

In the test mode, the input buffer circuits 23 receive input data Din from the associated input/output terminals I/O and supply write data D and /D associated with the input data Din to the internal circuit 52. The internal circuit 52 as a memory circuit writes the write data D and /D therein and outputs read data S and /S associated with the write data D and /D. The error detector 22 receives the write data D and read data S both having H levels or L levels and outputs the output signal ER which is held at a high-impedance state. Accordingly, an H-level output signal is sent out from the external terminal /ET which is connected to the node N14. In other words, when the write data D and the read data S match with each other in response to the proper operation of the internal circuit 52, the H-level output signal is output from the external terminal /ET.

When receiving the write data D and read data S one of which has an H level while the other has an L level, the error detector 22 sends out the L-level output signal ER. This output signal ER forcibly sets the level at the output terminal of the upload circuit 20a to an L level. In response to the L-level signal, the NAND gate 17b sends out an H-level output signal and the inverter 20b outputs an L-level output signal. The NOR gate 21 sends out an H-level output signal. Consequently, the node N14 becomes an L level so that an L-level output signal is sent out from the external terminal /ET. That is, when the write data D and the read data S do not match with each other due to improper operation of the internal circuit 52, the L-level output signal is output from the external terminal /ET.

In the test mode, the individual switches SW in the equivalent circuit shown in FIG. 18 are closed and the individual switches /SW are opened. When any one of the XOR gates 70 each of which is equivalent to the error detector 22 sends out an L-level output signal, the L-level error detection signal ER is supplied to the external terminal /ET.

According to the synchronous DRAM equipped with the test circuit 60 of the second embodiment, the input/output terminals I/O serve as input terminals for receiving input data Din and the external terminal /ET serves as the output terminal for outputting the test result in the test mode. It is therefore possible to conduct an operation test while making the input terminals independent of the output terminal. Therefore, a high-frequency operation test can reliably be performed after packaging.

Third Embodiment

The third embodiment of the invention will be now discussed with reference to the accompanying drawings. In the third embodiment, one of two adjoining input/output terminals I/O is used as an input terminal for receiving input data Din and the other is used as an output terminal for sending out read data in the test mode.

A test circuit 80 according to the third embodiment comprises a test mode setting circuit 11a, the initialization circuit 12, an OE buffer circuit 13a, input buffer circuits 25, the output buffer circuits 15, and NOR gates 24a and 24b. The input buffer circuits 25 and the output buffer circuits 15 are provided in association with the input/output terminals. The test mode setting circuit 11a outputs two pairs of complementary test mode signals M1 and /M1 and M2 and /M2. The initialization circuit 12 has substantially the same structure as that of the first embodiment.

The OE buffer circuit 13a receives the output control signal /OE supplied from the external terminal /ET and the L-level test mode signal /M which is set in association with the test mode signals M1 and /M2 one of which has an L level. The OE buffer circuit 13a sends out the output control signals OE and /OE in response to the H-level test mode signal /M and sends out the H-level output control signal OE and the L-level output control signal /OE in response to the L-level test mode signal /M.

The NOR gate 24a has a first input terminal for receiving the test mode signal M1, a second input terminal for receiving the output control signal /OE and an output terminal for supplying an output signal to that output buffer circuit 15 which is associated with the even-numbered one of adjoining input/output terminals I/O. The NOR gate 24b has a first input terminal for receiving the test mode signal M2, a second input terminal for receiving the output control signal /OE and an output terminal for supplying an output signal to that output buffer circuit 15 which is associated with the odd-numbered one of adjoining input/output terminals I/O. Each output buffer circuit 15 is enabled in response to the H-level output signals supplied from the NOR gates 24a and 24b. The input buffer circuits 25 commonly receive the input data Din supplied from the even-numbered and odd-numbered input/output terminals I/O and receive the test mode signals M1 and M2.

Test Mode Setting Circuit

Figures 22A, 22B:
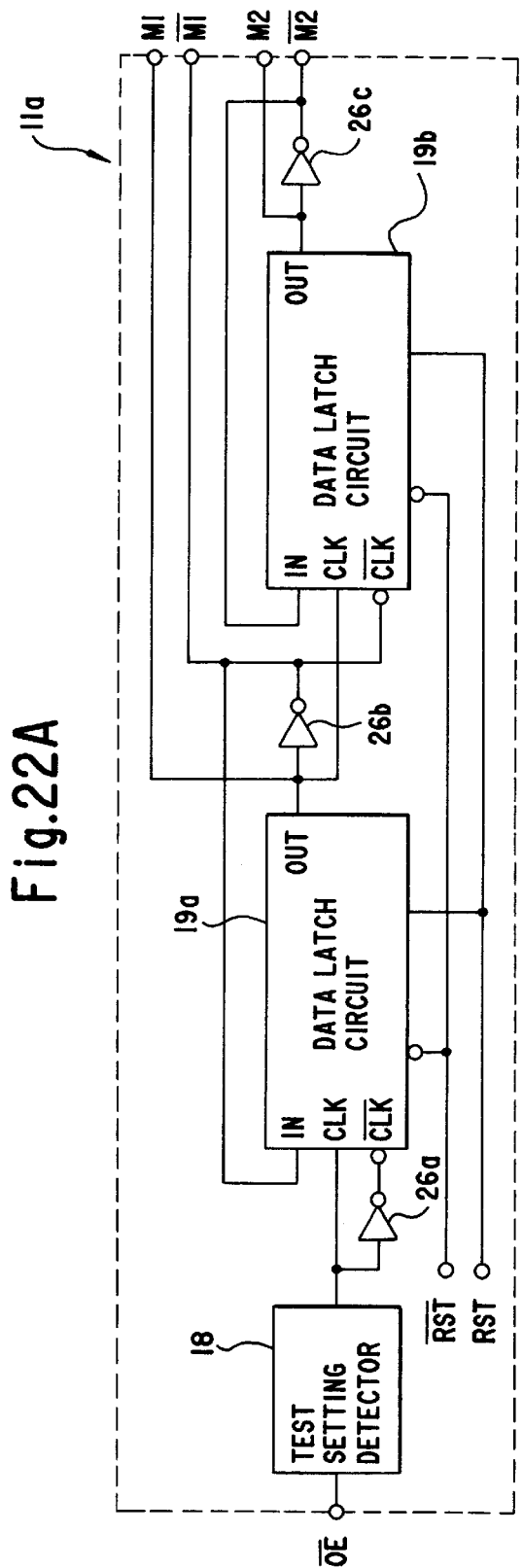
FIGS. 22A and 22B are circuit diagrams; showing a first example of a test mode setting circuit included in the test circuit of FIG. 20.

As shown in FIG. 22A, the test mode setting circuit 11a includes the test setting detector 18, first and second data latch circuits 19a and 19b, and three inverters 26a, 26b and 26c. The test setting detector 18 and the first and second data latch circuits 19a and 19b have substantially the same structures as the circuits 18 and 19 in the first embodiment illustrated in FIG. 11.

The first data latch circuit 19a receives the output signal of the test setting detector 18 as a clock signal and receives the clock signal /CLK output from the inverter 26a. The first data latch circuit 19a sends out the output signal as the test mode signal Ml and outputs the output signal, which has been inverted by the inverter 26b, as the test mode signal /M1. The second data latch circuit 19b receives the test mode signal Ml as the clock signal CLK and receives the test mode signal /M as the clock signal /CLK. The second data latch circuit 19b sends out the output signal as the test mode signal M2 and outputs the output signal, which has been inverted by the inverter 26c, as the test mode signal /M2. When power is given, the first and second data latch circuits 19a and 19b receive the reset signals RST and /RST from the initialization circuit 12.

As shown in FIG. 22B, the normal mode is set when the test mode setting circuit 11a outputs the L-level test mode signals M1 and M2. When the test mode signals M1 and M2 one of which has an H level while the other has an L level are output, the test mode is set.

When power is given, the test mode setting circuit 11a outputs the L-level test mode signals M1 and M2 in response to the reset signals RST and /RST. Then, the test setting detector 18 supplies an L-level output signal to the first data latch circuit 19a in response to the input signal /OE of a predetermined level for setting the test mode. The first data latch circuit 19a outputs the H-level test mode signal M1 in response to the L-level output signal and the second data latch circuit 19b outputs the L-level test mode signal M2. Next, the first data latch circuit 19a outputs the test mode signal M1 whose level has been inverted to an L level in response to the L-level output signal which is supplied again from the test setting detector 18, and the second data latch circuit 19b outputs the H-level test mode signal M2 in response to the L-level test mode signal M1. Subsequently, the first data latch circuit 19a outputs the test mode signal M1 whose level has been inverted to an H level in response to the L-level output signal which is supplied again from the test setting detector 18, and the second data latch circuit 19b outputs the H-level test mode signal M2. Then, the first data latch circuit 19a outputs the test mode signal M1 whose level has been inverted to an L level in response to the L-level output signal which is supplied again from the test setting detector 18, and the second data latch circuit 19b outputs the test mode signal M2 whose level has been inverted to an L level. In this manner, the test mode setting circuit 11a is restored to the initial state. Every time the L-level output signal is output from the test setting detector 18, the above-described operation is repeated.

Figures 23A, 23B:
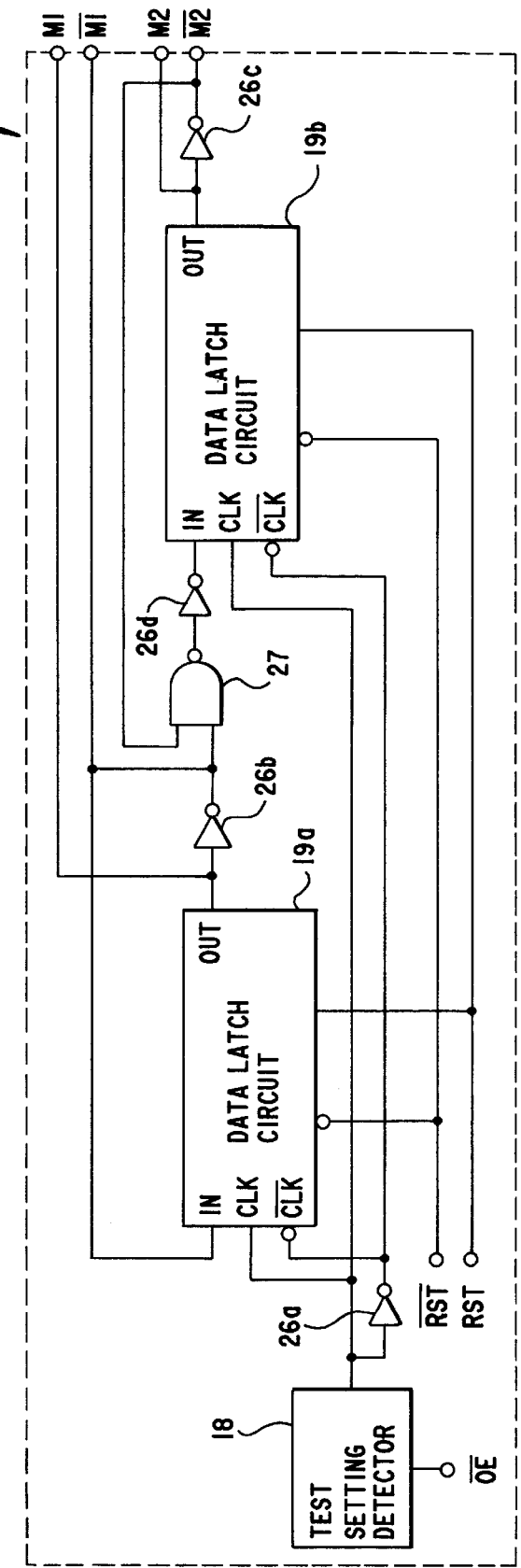
FIGS. 23A and 23B are circuit diagrams; and showing a second example of the test mode setting circuit.

FIG. 23A illustrates a first modification of the test mode setting circuit 11a. The first and second data latch circuits 19a and 19b in this test mode setting circuit 11a receive the output signal (clock signal CLK) of the test setting detector 18 and the output signal (clock signal /CLK) of the inverter 26a in parallel.

The test mode setting circuit 11a includes a NAND gate 27. The NAND gate 27 has a first input terminal for receiving the test mode signal M1 output from the inverter 26b, a second input terminal for receiving the test mode signal M2 output from the inverter 26c and an output terminal for supplying an output signal to the second data latch circuit 19b via an inverter 26d. Other structures are substantially the same as those of the test mode setting circuit 11a shown in FIG. 22A. As shown in FIG. 23B, every time the L-level output signal is supplied from the test setting detector 18, the test mode setting circuit 11a outputs the test mode signals M1 and M2 which are the same as those shown in FIG. 22B.

FIG. 24A illustrates a second modification of the test mode setting circuit 11a. The second data latch circuit 19b in this test mode setting circuit 11a receives the output signal of the first data latch circuit 19a. The first data latch circuit 19a receives the output signal of the second data latch circuit 19b via the inverter 26c. Other structures are substantially the same as those of the test mode setting circuit 11a shown in FIG. 23A. As shown in FIG. 24B, every time the L-level output signal is supplied from the test setting detector 18, the test mode setting circuit 11a outputs the test mode signals M1 and M2 which have predetermined levels.

Input Buffer Circuit

As shown in FIG. 25, each input buffer circuit 25 receives input data Din from an even-numbered input/output terminal I/O, input data Din from an odd-numbered input/output terminal I/O, and test mode signals M1 and M2.

In the normal mode, the input buffer circuit 25 sends out the even-numbered and odd-numbered input data Din respectively as even-numbered and odd-numbered write data D and /D output in response to the L-level test mode signals M1 and M2.

In the test mode, the input buffer circuit 25 sends out only the odd-numbered input data Din as even-numbered write data D and /D output in response to the H-level test mode signal M1 and the L-level test mode signal M2. At this time, the odd-numbered write data D is fixed to an L level and the odd-numbered write data /D is fixed to an H level.

In the test mode, the input buffer circuit 25 sends out only the even-numbered input data Din as odd-numbered write data D and /D output in response to the L-level test mode signal M1 and the H-level test mode signal M2. At this time, the even-numbered write data D is fixed to an L level and the even-numbered write data /D is fixed to an H level.

Figure 21:
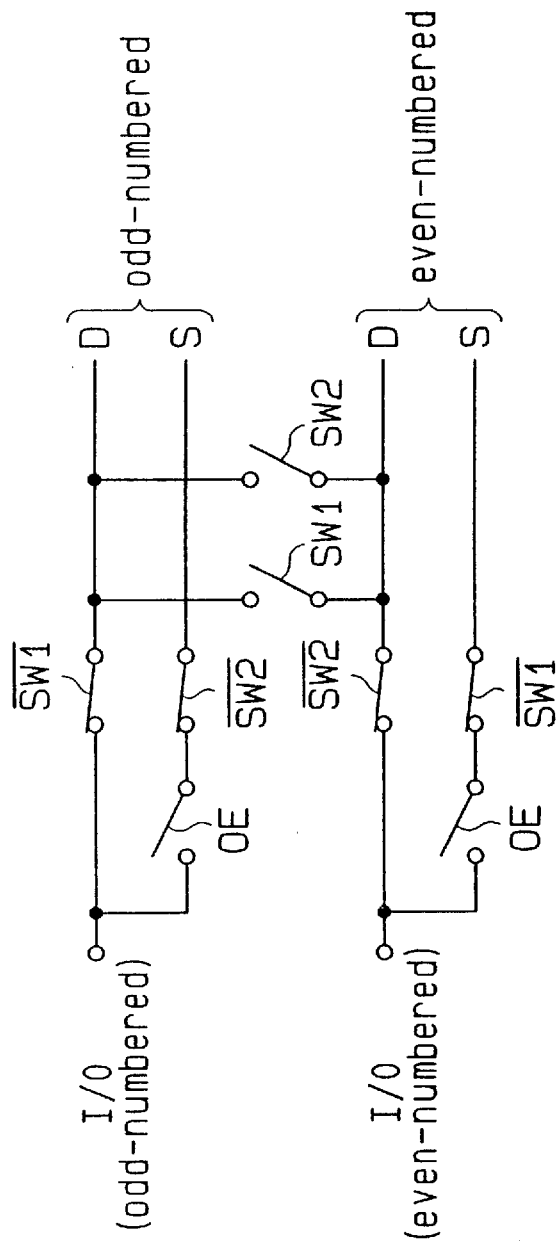
FIG. 21 is a diagram showing an equivalent circuit of the test circuit of FIG. 20.

FIG. 21 shows an equivalent circuit of the test circuit according to the third embodiment. A switch SW1 is closed in response to the H-level test mode signal M1, and switches /SW1 are closed in response to the L-level test mode signal M1. A switch SW2 is closed in response to the H-level test mode signal M2, and switches /SW2 are closed in response to the L-level test mode signal M2. Switches OE are opened or closed in response to the output control signal /OE.

Operation of Test Circuit

Figure 20:
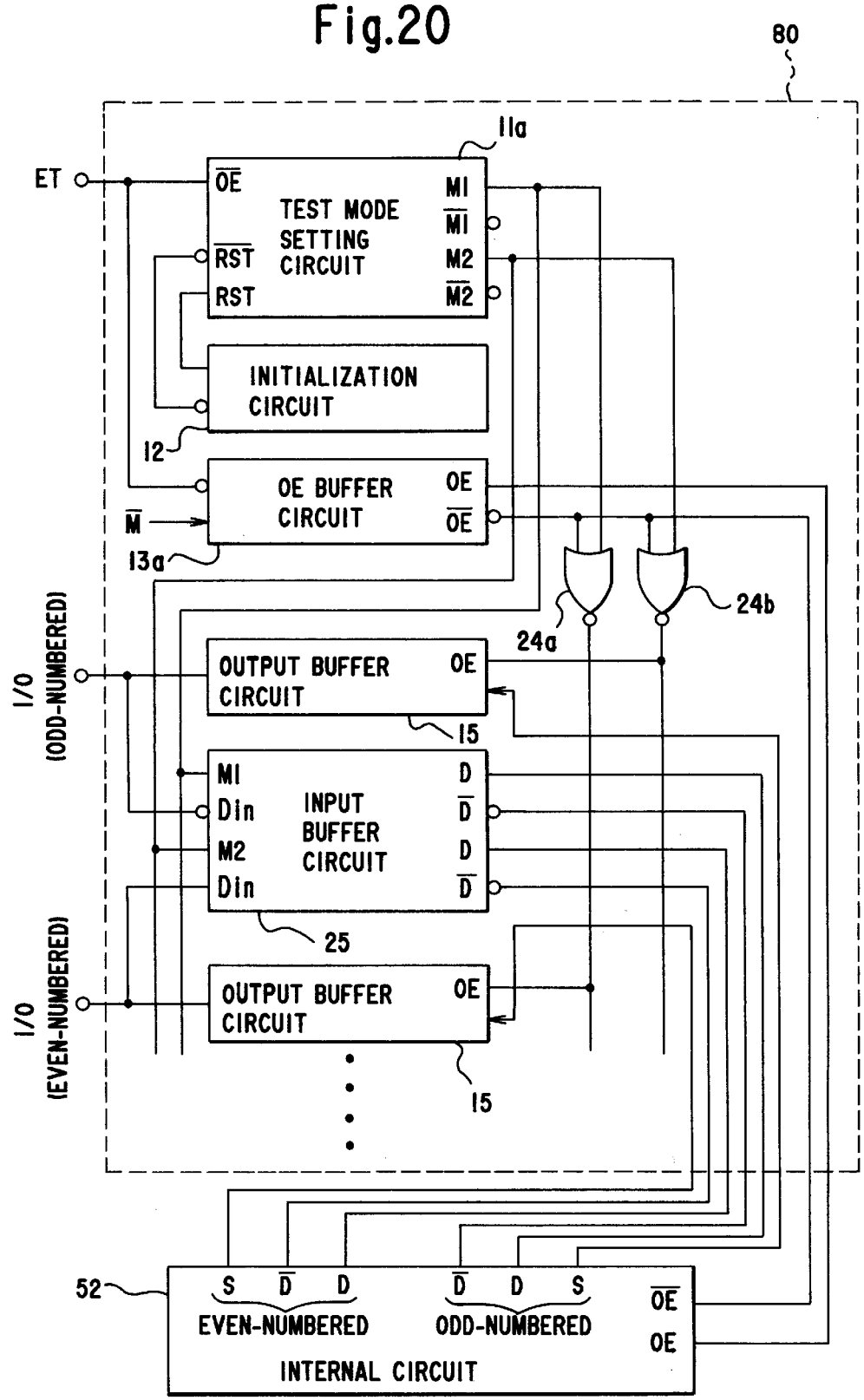
FIG. 20 is a block diagram illustrating a test circuit according to the third embodiment of the invention.

Referring to FIG. 20, the test mode signals M1 and M2 both having L levels are supplied to the NOR gates 24a and 24b from the test mode setting circuit 11a in the normal mode. The NOR gates 24a and 24b output the output control signal OE, which is the inverted signal of the output control signal /OE, to the odd-numbered output buffer circuits 15 and the even-numbered output buffer circuits 15. Under this situation, the individual output buffer circuits 15 are enabled in response to the output control signal /OE in the read mode. The input buffer circuits 25 output the input data Din received from the odd-numbered input/output terminals I/O as odd-numbered write data D and /D and output the input data Din received from the even-numbered input/output terminals I/O as even-numbered write data D and /D. This condition will be now described with reference to the equivalent circuit shown in FIG. 21. The switches SW1 and SW2 are opened, the switches /SW1 and /SW2 are closed, and the switches OE are opened or closed in response to the output control signal. In this state, data writing and data reading in the normal mode are possible.

In the test mode, the NOR gate 24a sends out the L-level output signal to the output buffer circuits 15, which are connected to the even-numbered input/output terminals I/O, in response to the H-level test mode signal M1. Consequently, the even-numbered output buffer circuits 15 are disabled. the NOR gate 24b sends out the output control signal OE, which is the inverted signal of the output control signal /OE, to the output buffer circuits 15, which are connected to the odd-numbered input/output terminals I/O, in response to the L-level test mode signal M2. Consequently, the odd-numbered output buffer circuits 15 are enabled in the read mode.

The input buffer circuits 25 output the input data Din received from the even-numbered input/output terminals I/O as odd-numbered write data D and /D to the internal circuit 52. In the test mode, therefore, the internal circuit 52 executes the writing operation with the input data Din from the even-numbered input/output terminals I/O as odd-numbered write data D and /D. Odd-numbered read data S, acquired in the reading operation which is carried out following the writing operation by the internal circuit 52, is supplied to the odd-numbered output buffer circuits 15 from which the data is further supplied to the odd-numbered input/output terminals I/O. This state is equivalent to the switches SW1 and /SW2 closed and the switches /SW1 and SW2 opened in the equivalent circuit shown in FIG. 21.

In the test mode, the NOR gate 24a sends out the output control signal OE, which is the inverted output control signal /OE, to the associated output buffer circuits 15 in response to the L-level test mode signal M1. Consequently, the even-numbered output buffer circuits 15 are enabled in the read mode. The NOR gate 24b sends out the L-level output signal to the associated output buffer circuits 15 in response to the H-level test mode signal M2. Consequently, the odd-numbered output buffer circuits 15 are disabled.

The input buffer circuits 25 output the input data Din received from the odd-numbered input/output terminals I/O as even-numbered write data D and /D to the internal circuit 52. In this test mode, therefore, the internal circuit 52 executes the writing operation with the input data Din from the odd-numbered input/output terminals I/O as even-numbered write data D and /D. Even-numbered read data S, acquired in the reading operation which is carried out following the writing operation by the internal circuit 52, is supplied to the even-numbered output buffer circuits 15 from which the data is further supplied to the even-numbered input/output terminals I/O. This state is equivalent to the switches SW1 and /SW2 opened and the switches /SW1 and SW2 closed in the equivalent circuit shown in FIG. 21.

When the test mode signals M1 and M2 both have H levels output from the test mode setting circuit 11a, the input buffer circuits 25 and the output buffer circuits 15 are disabled to disable the writing and reading operations.

As discussed above, the test circuit 80 according to the third embodiment can set the test mode when the input signal /OE having a predetermined high voltage level. In the test mode, one of an odd-numbered input/output terminal I/O and an even-numbered input/output terminal I/O is used as an input terminal and the other as an output terminal. Accordingly, a fast "operation test" for the internal circuit 52 can be reliably performed after packaging.

Fourth Embodiment

Figure 26:
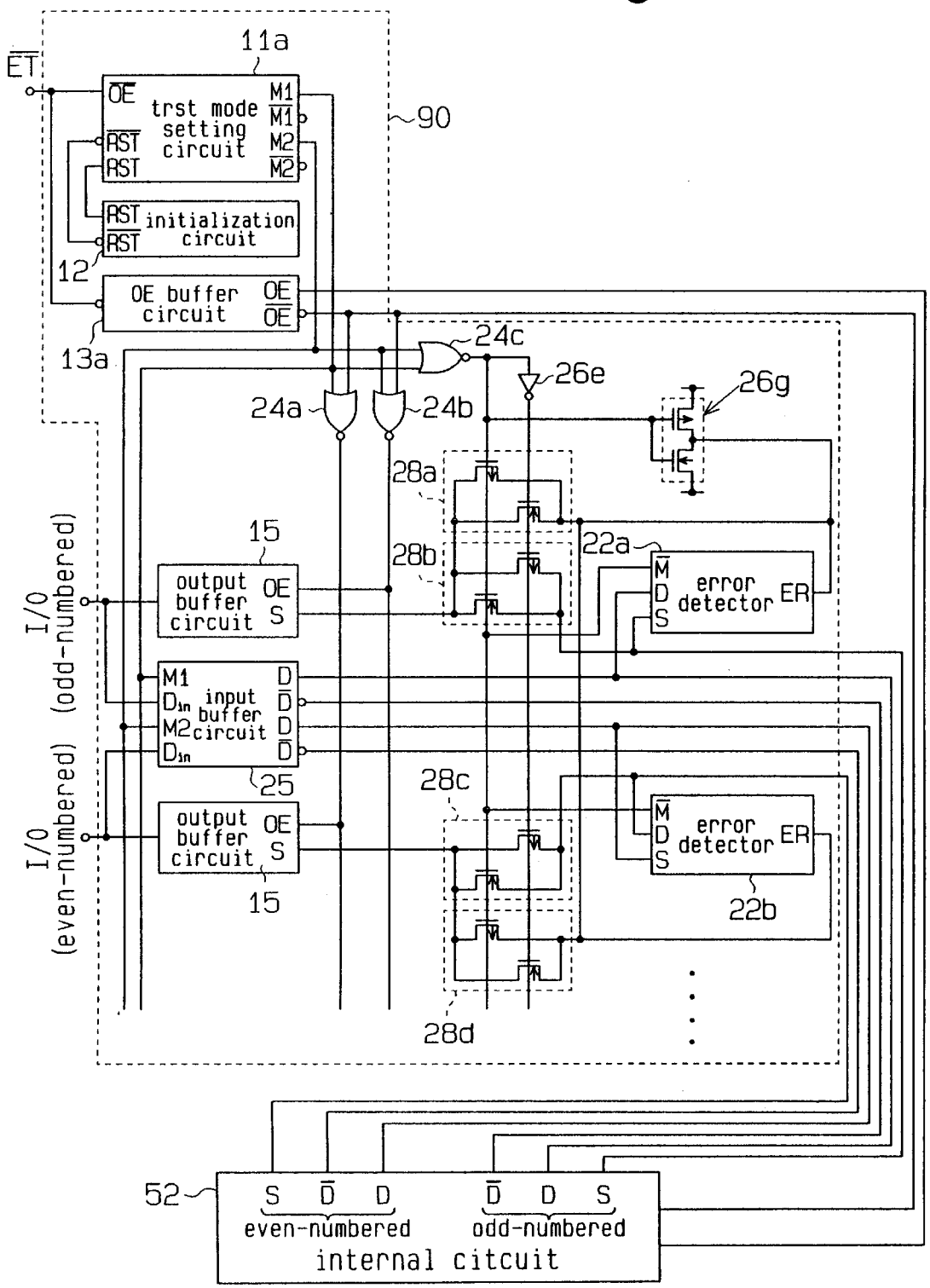
FIG. 26 is a block diagram illustrating a test circuit according to the fourth embodiment of the invention.

A test circuit according to the fourth embodiment of the invention will now be discussed with reference to the accompanying drawings. As shown in FIG. 26, a test circuit 90 of the fourth embodiment comprises the individual circuits 11a, 12, 13a, 15, 25, 24a and 24b of the test circuit 80 of the third embodiment, a NOR gate 24c, an upload circuit (inverter) 26g, an inverter 26e, first to fourth switch circuits 28a, 28b, 28c and 28d and first and second error detectors 22a and 22b.

The NOR gate 24c receives the test mode signals M and /M and supplies its output signal to the first to fourth switch circuits 28a–28d. The inverter 26e receives the output signal of the NOR gate 24c and supplies the logic-level inverted signal to the first to fourth switch circuits 28a–28d.

The first and fourth switch circuits 28a and 28d are closed in response to the L-level output signal of the NOR gate 24c. The second and third switch circuits 28b and 28c are closed in response to the H-level output signal of the NOR gate 24c. The first and second error detectors 22a and 22b have the same structures as the error detector of the second embodiment. The first error detector 22a is provided in association with the odd-numbered input/output terminals I/O and compares odd-numbered write data D supplied from the associated input buffer circuits 25 with odd-numbered read data S. The first error detector 22a supplies the output signal (error detection signal) ER indicating the comparison result to the odd-numbered output buffer circuits 15 via the upload circuit 26g and the first and second switch circuits 28a and 28b. The second error detector 22b is provided in association with the even-numbered input/output terminals I/O and compares even-numbered write data D supplied from the associated input buffer circuits 25 with even-numbered read data S. The second error detector 22b supplies the output signal ER indicating the comparison result to the even-numbered output buffer circuits 15 via the upload circuit 26g and the third and fourth switch circuits 28c and 28d.

The output signal of the NOR gate 24c is supplied as the test mode signal /M to the first and second error detectors 22a and 22b via the first and second switch circuits 28a and 28b. The upload circuit 26g supplies its output signal which is the inverted signal of the output signal of the NOR gate 24c to the first and fourth switch circuits 28a and 28d. When the first switch 28a is closed, the output signal of the upload circuit 26g is supplied to the odd-numbered output buffer circuits 15 via the first and second switch circuits 28a and 28b. When the fourth switch 28d is closed, the output signal of the upload circuit 26g is supplied to the even-numbered output buffer circuits 15 via the third and fourth switch circuits 28c and 28d.

The load driving performance of the upload circuit 26g is designed to be sufficiently smaller than the load driving performance of the output stages of the first and second error detectors 22a and 22b. When the logic levels of the output signals from both circuits 26g and 22a differ from each other, the output signal of the first error detector 22a is forcibly supplied to the odd-numbered output buffer circuits 15 via the first and second switch circuits 28a and 28b. When the logic levels of the output signals from both circuits 26g and 22b differ from each other, the output signal of the second error detector 22b is forcibly supplied to the even-numbered output buffer circuits 15 via the third and fourth switch circuits 28c and 28b.

Figure 27:
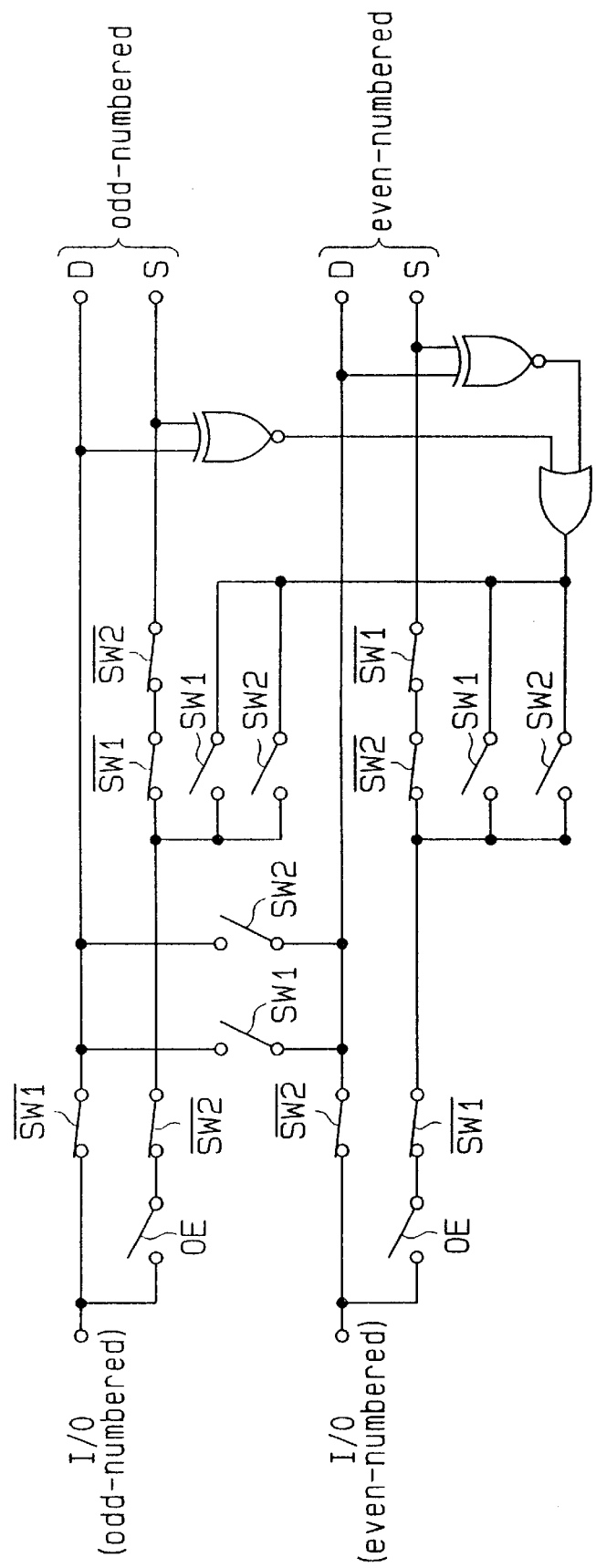
FIG. 27 is a diagram showing an equivalent circuit of the test circuit of FIG. 26.

FIG. 27 shows an equivalent circuit of the test circuit 90. The switches SW1, /SW1, SW2, /SW2 and OE operate in substantially the same way as those in the third embodiment. Each Exclusive NOR gate 92 is equivalent to the error detector 22.

Operation of Test Circuit

In the normal mode, the NOR gate 24c sends out the H-level output signal in response to the L-level test mode signals M1 and M2. In response to this H-level output signal and the L-level output signal of the inverter 26e, the second and third switch circuits 28b and 28c are opened and the first and fourth switch circuits 28a and 28d are closed. The first and second error detectors 22a and 22b are disabled by the H-level output signal which has passed the second switch circuit 28b and output the output signals ER in a high-impedance state. In this manner, the internal circuit 52 receives the input data Din as write data D and /D via the individual input/output terminals I/O and input buffer circuits 25 in the normal mode. Each output buffer circuit 15 receives the read data S from the internal circuit 52 via the second or fourth switch circuit 28b or 28c and supplies output data to the associated input/output terminal I/O.

In the test mode, the NOR gate 24c sends out the L-level output signal in response to the test mode signals M1 and M2 one of which has an H level while the other has an L level. In response to this L-level output signal and the H-level output signal of the inverter 26e, the first and fourth switch circuits 28a and 28d are closed and the second and third switch circuits 28b and 28c are opened. The upload circuit 26g sends out the H-level output signal. In the test mode, the input buffer circuits 25 supply the input data Din, received from the odd-numbered input/output terminals I/O, to the internal circuit 52 as even-numbered write data D and /D. The second error detector 22b receives even-numbered read data S which is output from the internal circuit 52 and is associated with the even-numbered write data D. When the write data D matches with the read data S, the second error detector 22b outputs the output signal ER in a high-impedance state. In this manner, the even-numbered output buffer circuits 15 receive the H-level output signal from the upload circuit 26g as the test result via the third and fourth switch circuits 28c and 28d, and supplies this signal to the even-numbered input/output terminals I/O. When the write data D does not match with the read data S, the second error detector 22b outputs the L-level output signal ER. Even though the H-level output signal is output from the upload circuit 26g, therefore, the L-level output signal is forcibly supplied as the test result to the even-numbered input/output terminals I/O via the third and fourth switch circuits 28c and 28d.

As discussed above, the test circuit 90 of the fourth embodiment receives the input data Din from the odd-numbered input/output terminals I/O or the even-numbered input/output terminals I/O and supplies the data as write data D to the internal circuit 52. The test circuit 90 comprises the first and second error detectors 22a and 22b to determine if the write data D matches with the read data S from the internal circuit 52. The test circuit 90 sends out the output signal ER indicating the test result from those of the odd-numbered input/output terminals I/O and even-numbered input/output terminals I/O which differ from the input/output terminals I/O to which the input data Din has been supplied. Like the test circuit of the third embodiment, therefore, the test circuit 90 of the fourth embodiment can reliably conduct a fast operation test for the internal circuit 52, and equivalence thereof.

Although only four embodiments of the present invention have been described herein, it should be apparent to those skilled in the art that the present invention may be embodied in many other specific forms without departing from the spirit or scope of the invention. Particularly, it should be understood that the invention may be embodied in the following form.

In the first to fourth embodiments, the output control signal /OE having a predetermined voltage level for setting the test mode may be supplied to an external terminal different from the external terminal /ET.

Therefore, the present examples and embodiments are to be considered as illustrative and not restrictive and the invention is not to be limited to the details given herein, but may be modified within the scope and equivalence of the appended claims.

What is claimed is:

1. A semiconductor integrated circuit device comprising:
   a plurality of input/output terminals;
   an input terminal;
   an internal circuit for receiving input data via said plurality of input/output terminals and outputting output data therefrom; and
   a test circuit for permitting data exchange among said plurality of input/output terminals, said input terminal and said internal circuit,
   wherein said test circuit operates in a normal mode to supply input data to said internal circuit through said input/output terminals, and supply output data from said internal circuit through said input/output terminals, and said test circuit operates in a test mode to supply test input data to said internal circuit through one of said input terminal and said input/output terminals, and to supply test output data that is output from said internal circuit to one of said input terminal and said input/output terminals which differs from said test input data supplied terminal.

2. The semiconductor integrated circuit device according to claim 1, wherein said test circuit includes an error detector for comparing said test output data with said test input data to enable detection of an error in said test mode.

3. The semiconductor integrated circuit device according to claim 2, wherein when said error detector detects an error, said test circuit operates to supply an error detection result instead of said test output data to one of said input terminal and said input/output terminals which differs from said test input data supplied terminal.

4. The semiconductor integrated circuit device according to claim 1, wherein in said test mode, said test circuit operates to supply test input data that is input to a first input/output terminal, to said internal circuit as test input data for a second input/output terminal, and supply test output data, output from said internal circuit and originating from said test input data input to said first input/output terminal, to said second input/output terminal.

5. The semiconductor integrated circuit device according to claim 4, wherein said test circuit includes an error detector for comparing said test output data with said test input data to enable detection of an error in said test mode.

6. The semiconductor integrated circuit device according to claim 5, wherein when said error detector detects an error, said test circuit operates to supply an error detection result instead of said test output data to said second input/output terminal.

7. A semiconductor integrated circuit device comprising:
   a plurality of input/output terminals;
   a control signal input terminal;
   an internal circuit for receiving input data via said plurality of input/output terminals and outputting output data therefrom; and
   a test circuit for permitting data exchange among said plurality of input/output terminals, said control signal input terminal and said internal circuit, said test circuit including,
      a plurality of input buffer circuits for receiving input data input through said input/output terminals, and supplying said input data to said internal circuit in response to a first control signal in a normal mode, and
      a plurality of output buffer circuits for receiving output data from said internal circuit and supplying said output data to the associated input/output terminals in response to said first control signal in a normal mode,
   wherein in a test mode, in response to a second control signal supplied to said control signal input terminal, said test circuit controls said input buffer circuits to supply test input data that is input to one of said control signal input terminal and said input/output terminals to said internal circuit, and said test circuit further controls said output buffer circuits to supply test output data that is output from said internal circuit to one of said control signal input terminal and said input/output terminals which differs from said test input data supplied terminal.

8. The semiconductor integrated circuit device according to claim 7, wherein said test circuit includes a plurality of error detectors for comparing said test output data with said test input data to enable the detection of an error in said test mode.

9. The semiconductor integrated circuit device according to claim 8, wherein when each of said error detectors detect an error, said test circuit controls said output buffer circuits to supply an error detection result instead of said test output data to one of said control signal input terminal and said input/output terminals which differ from said test input data supplied terminal.

10. The semiconductor integrated circuit device according to claim 7, wherein each of said input buffer circuits are commonly connected to a pair of adjoining first and second input/output terminals; and
   wherein in said test mode, said test circuit controls said input buffer circuits to supply test input data that is input to said first input/output terminal to said internal circuit as test input data for said second input/output terminal, and said test circuit controls said output buffer circuits to supply test output data that is output from said internal circuit to said second input/output terminal.

11. The semiconductor integrated circuit device according to claim 10, wherein said test circuit includes a plurality of error detectors for comparing said test output data with said test input data to enable the detection of an error in said test mode.

12. The semiconductor integrated circuit device according to claim 11, wherein when each of said error detectors detect an error, said test circuit controls said output buffer circuits to supply an error detection result instead of said test output data to said second input/output terminal.

13. A semiconductor integrated circuit device comprising:
   a plurality of input/output terminals;
   a control signal input terminal;
   an internal circuit for receiving input data via said plurality of input/output terminals and outputting output data therefrom; and
   a test circuit for permitting data exchange among said plurality of input/output terminals, said control signal input terminal and said internal circuit, said test circuit including,
      a test mode setting circuit being connected to said control signal input terminal, said test mode setting circuit configured to produce a test mode setting signal in response to a set signal supplied to said control signal input terminal,
      a plurality of input buffer circuits being connected to said input/output terminals, said control signal input terminal, said internal circuit and said test mode setting circuit, said plurality of input buffer circuits being configured to receive input data that is input to said input/output terminals and supplying said input data to said internal circuit in response to an output control signal supplied to said control signal input terminal, and
      a plurality of output buffer circuits, connected to said input/output terminals, said internal circuit and said test mode setting circuit, said plurality of output buffer circuits being configured to receive output data from said internal circuit and supply said output data to the associated input/output terminals in response to said output set signal,
   wherein said input buffer circuits receive test input data that is input to said control signal input terminal, and said input buffer circuits supply said test input data to said internal circuit in response to said test mode setting signal, and said output buffer circuits supply test output data that is output from said internal circuit to the associated input/output terminals in response to said test mode setting signal.

14. A semiconductor integrated circuit device comprising:
   a plurality of input/output terminals;
   a control signal input terminal;

an internal circuit for receiving input data via said plurality of input/output terminals and outputting output data therefrom; and a test circuit for permitting data exchange among said plurality of input/output terminals, said control signal input terminal and said internal circuit, said test circuit including, a test mode setting circuit being connected to said control signal input terminal, said test mode setting circuit being configured to produce a test mode setting signal in response to a set signal that is supplied to said control signal input terminal, a plurality of input buffer circuits being connected to said input/output terminals, said internal circuit and said test mode setting circuit, said plurality input buffer circuits being configured to receive input data that is input to said input/output terminals and supply said input data to said internal circuit, and a plurality of output buffer circuits being connected to said input/output terminals, said control signal input terminal, said internal circuit and said test mode setting circuit, said plurality of output buffer circuits being configured to receive output data from said internal circuit and supply said output data to the associated input/output terminals in response to said output set signal that is supplied to said control signal input terminal, wherein said input buffer circuits receive test input data that is input to said input/output terminal and supply said test input data to said internal circuit in response to said test mode setting signal, and said output buffer circuits supply test output data that is output from said internal circuit to said control signal input terminal in response to said test mode setting signal.

15. The semiconductor integrated circuit device according to claim 14, wherein said test circuit includes a plurality of error detectors that are connected to said input buffer circuits, said test mode setting circuit and said internal circuit, said plurality of error detectors being configured to compare said test output data with said test input data in order to detect an error in response to said test mode setting signal; and wherein when each of said error detectors detect an error, said test circuit controls said output buffer circuits to supply an error detection result instead of said test output data to said control signal input terminal.

16. A semiconductor integrated circuit device comprising:
a plurality of input/output terminals;
a control signal input terminal;
an internal circuit for receiving input data via said plurality of input/output terminals and outputting output data therefrom; and
a test circuit for permitting data exchange among said plurality of input/output terminals, said control signal input terminal and said internal circuit, said test circuit including, a test mode setting circuit being connected to said control signal input terminal, said test mode setting circuit being configured to produce a test mode setting signal in response to a set signal supplied to said control signal input terminal, a plurality of input buffer circuits, each connected to a pair of adjoining first and second input/output terminals, said internal circuit and said test mode setting circuit, said plurality of input buffer circuits being configured to receive input data that is input to either said first or second input/output terminal, and supply said input data to said internal circuit, and a plurality of output buffer circuits being connected to said input/output terminals, said internal circuit and said test mode setting circuit, said plurality of output buffer circuits being configured to receive output data from said internal circuit and supply said output data to the associated input/output terminals in response to an output control signal that is supplied to said control signal input terminal, wherein each of said input buffer circuits supply test input data that is input to said first input/output terminal to said internal circuit as test input data for said second input/output terminal in response to said test mode setting signal, and said output buffer circuits associated with said second input/output terminals supply test output data that is output from said internal circuit and originated from said test input data to said second input/output terminal in response to said test mode setting signal.

17. The semiconductor integrated circuit device according to claim 16, wherein said test circuit includes a plurality of error detectors that are connected to said input buffer circuits, said test mode setting circuit and said internal circuit, said plurality of error detectors being configured to compare said test output data with said test input data to detect an error.

18. The semiconductor integrated circuit device according to claim 17, wherein when each of said error detectors detect an error, said test circuit controls said output buffer circuits to supply an error detection result instead of said test output data to said second input/output terminal.

19. A semiconductor device comprising:
an internal circuit;
a plurality of I/O terminals;
a plurality of input buffer circuits and output buffer circuits connected between the I/O terminals and the internal circuit;
an external terminal; and
a test circuit connected between the external terminal, the I/O terminals, and the internal circuit, the test circuit including a test mode setting circuit, and an OE buffer circuit, wherein in response to a set test mode signal at the external terminal, the test circuit generates a test mode signal for inhibiting the input buffer circuits from receiving input data from the I/O terminals and provides said input data to the input buffers by way of the external terminal and the OE buffer circuit, so that data output from the internal circuit to the output buffers does not contend with the input data for the I/O terminals.

20. The semiconductor device of claim 19 wherein the semiconductor device comprises a synchronous DRAM and the internal circuit comprises a memory circuit.

21. The semiconductor device of claim 19, wherein the test circuit further comprises an initialization circuit for supplying a reset signal to the test mode setting circuit.

22. The semiconductor device of claim 19, wherein each of the input buffers is connected to the test mode setting circuit for receiving the test mode signal, to the OE buffer circuit for receiving the input data from the OE buffer circuit, to an associated one of the I/O terminals for receiving input data therefrom, and to the internal circuit for passing the input data to the internal circuit.

* * * * *